(12) United States Patent
Hamada et al.

(10) Patent No.: US 11,876,449 B2
(45) Date of Patent: Jan. 16, 2024

(54) INDUCTOR COMPONENT, PACKAGE COMPONENT, AND SWITCHING REGULATOR

(71) Applicant: Murata Manufacturing Co., Ltd., Kyoto-fu (JP)

(72) Inventors: Akinori Hamada, Nagaokakyo (JP); Yoshimasa Yoshioka, Nagaokakyo (JP); Hayami Kudo, Nagaokakyo (JP); Shinji Yasuda, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 275 days.

(21) Appl. No.: 16/894,701

(22) Filed: Jun. 5, 2020

(65) Prior Publication Data

US 2020/0304025 A1    Sep. 24, 2020

Related U.S. Application Data

(63) Continuation of application No. 15/278,198, filed on Sep. 28, 2016, now Pat. No. 10,715,041.

(30) Foreign Application Priority Data

Oct. 2, 2015    (JP) .................... 2015-197028

(51) Int. Cl.
  *H01F 17/00*    (2006.01)
  *H02M 3/158*    (2006.01)
  (Continued)

(52) U.S. Cl.
  CPC .......... *H02M 3/158* (2013.01); *G06F 1/1635* (2013.01); *G06F 1/3296* (2013.01);
  (Continued)

(58) Field of Classification Search
  CPC ............. H01F 17/0013; H01F 27/2804; H01F 2027/2809; H01F 17/0006; H01F 5/003;
  (Continued)

(56) References Cited

U.S. PATENT DOCUMENTS 6,140,902 A    10/2000  Yamasawa et al.
6,914,513 B1    7/2005  Wahlers et al.
(Continued)

FOREIGN PATENT DOCUMENTS

CN    1838349 A    9/2006
JP    2001-102235 A    4/2001
(Continued)

OTHER PUBLICATIONS

An Office Action; "Notification of Reasons for Refusal," Mailed by the Japanese Patent Office dated Dec. 18, 2018, which corresponds to Japanese Patent Application No. 2015-197028 and is related to U.S. Appl. No. 15/278,198; with English language translation.
(Continued)

*Primary Examiner* — Tszfung J Chan
(74) *Attorney, Agent, or Firm* — Studebaker & Brackett PC

(57) ABSTRACT

An inductor component includes a composite body that includes a plurality of composite layers each including a composite material of an inorganic filler and a resin; and a plurality of spiral wires that each are stacked on the composite layer, the spiral wires each being covered with the other composite layer. The average particle diameter of the inorganic filler is equal to or smaller than 5 μm, the wire pitch of the spiral wires is equal to or smaller than 10 μm, and the interlayer pitch between adjacent spiral wires is equal to or smaller than 10 μm.

15 Claims, 25 Drawing Sheets

(51) Int. Cl.

| | | |
|---|---|---|
| *G06F 1/16* | (2006.01) | |
| *G06F 1/3296* | (2019.01) | |
| *H01F 1/03* | (2006.01) | |
| *H01F 27/255* | (2006.01) | |
| *H01F 27/28* | (2006.01) | |
| *H01F 27/29* | (2006.01) | |
| *H01F 27/32* | (2006.01) | |
| *H02M 3/155* | (2006.01) | |

(52) U.S. Cl.
CPC ....... *H01F 1/0306* (2013.01); *H01F 17/0013* (2013.01); *H01F 27/255* (2013.01); *H01F 27/2823* (2013.01); *H01F 27/29* (2013.01); *H01F 27/32* (2013.01); *H01F 2017/0066* (2013.01); *H02M 3/155* (2013.01)

(58) Field of Classification Search
CPC ...... H01F 27/2823; H01F 27/29; H01F 27/32; H01F 2017/0066; H01F 1/0306; H01F 27/255
USPC .................................. 336/200, 232
See application file for complete search history.

(56) References Cited

U.S. PATENT DOCUMENTS

| | | | | |
|---|---|---|---|---|
| 2001/0033219 A1* | 10/2001 | Iha | ........................ | G03F 7/0047 336/200 |
| 2002/0041223 A1 | 4/2002 | Uriu et al. | | |
| 2006/0214759 A1* | 9/2006 | Kawarai | ............. | H01F 17/0006 336/200 |
| 2008/0257488 A1 | 10/2008 | Yamano | | |
| 2009/0085708 A1* | 4/2009 | Matsumoto | ......... | H01F 17/0013 336/200 |
| 2010/0157565 A1 | 6/2010 | Yoshida et al. | | |
| 2011/0291790 A1 | 12/2011 | Okumura et al. | | |
| 2013/0222101 A1 | 8/2013 | Ito et al. | | |
| 2013/0249662 A1 | 9/2013 | Tonoyama et al. | | |
| 2013/0258623 A1 | 10/2013 | Zeng | | |
| 2014/0002226 A1* | 1/2014 | Moon | ................... | H01F 41/041 336/200 |
| 2014/0009254 A1* | 1/2014 | Ohkubo | .............. | H01F 17/0033 336/192 |
| 2014/0034373 A1 | 2/2014 | Yoshikawa et al. | | |
| 2014/0176282 A1 | 6/2014 | Jung et al. | | |
| 2014/0176284 A1 | 6/2014 | Lee et al. | | |
| 2015/0130580 A1 | 5/2015 | Lee et al. | | |
| 2015/0255206 A1* | 9/2015 | Han | ....................... | H01F 41/041 336/192 |
| 2016/0155550 A1* | 6/2016 | Ohkubo | .................... | H01F 1/24 336/233 |
| 2016/0163438 A1* | 6/2016 | Moon | ................... | H01F 27/292 336/212 |
| 2016/0163451 A1* | 6/2016 | Wang | .................. | H01F 27/2804 336/200 |
| 2016/0343500 A1* | 11/2016 | Jung | ...................... | H01F 41/042 |
| 2017/0032882 A1* | 2/2017 | Yang | ................... | H01F 27/2804 |

FOREIGN PATENT DOCUMENTS

| | | | | |
|---|---|---|---|---|
| JP | 2004-201333 | A | | 7/2004 |
| JP | 2008-294085 | A | | 12/2008 |
| JP | 2010205905 | A | * | 9/2010 |
| JP | 2011-014747 | A | | 1/2011 |
| JP | 2013-138231 | A | | 7/2013 |
| JP | 2013-211431 | A | | 10/2013 |
| JP | 2013-225718 | A | | 10/2013 |
| JP | 2014-011458 | A | | 1/2014 |
| JP | 2015-032625 | A | | 2/2015 |
| JP | 2015-076599 | A | | 4/2015 |
| JP | 2015-119033 | A | | 6/2015 |
| JP | 2015-126202 | A | | 7/2015 |
| JP | 5750528 | B1 | | 7/2015 |
| WO | 2014/061670 | A1 | | 4/2014 |
| WO | WO-2014061670 | A1 | * | 4/2014 ............... H01F 1/01 |
| WO | 2014/115434 | A1 | | 7/2014 |

OTHER PUBLICATIONS

An Office Action mailed by the Chinese Patent Office dated Nov. 16, 2018, which corresponds to Chinese Patent Application No. 201610868182.3 and is related to U.S. Appl. No. 15/278,198 with English language translation.

An Office Action issued by the Japanese Patent Office dated Aug. 21, 2018, which corresponds to Japanese Patent Application No. 2015-197028 and is related to U.S. Appl. No. 15/278,198; with English translation.

An Office Action; "Notification of Reasons for Rejection," issued by the Japanese Patent Office dated Apr. 24, 2018, which corresponds to Japanese Patent Application No. 2015-197028 and is related to U.S. Appl. No. 15/278,198.

* cited by examiner

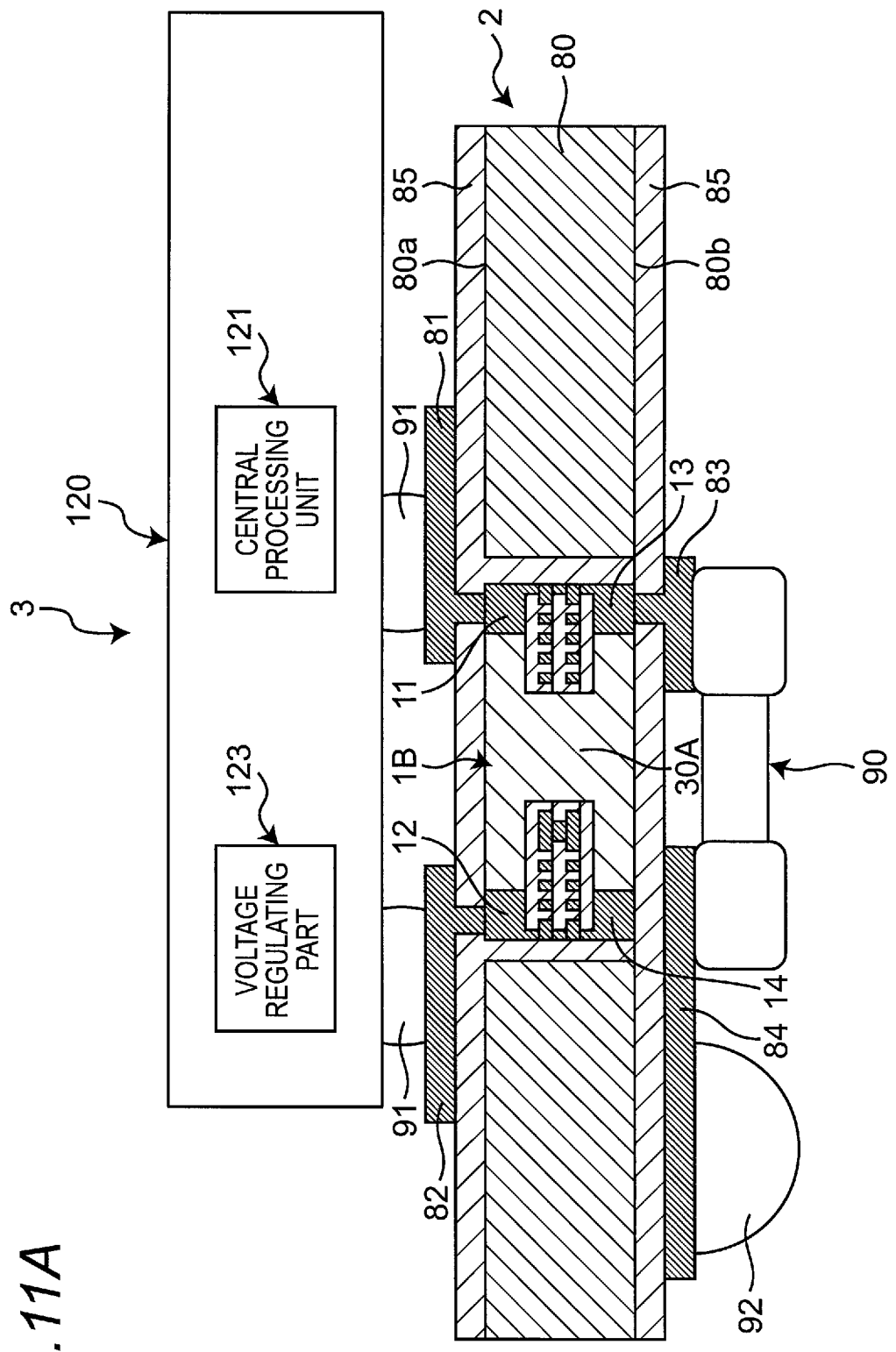

INDUCTOR COMPONENT, PACKAGE COMPONENT, AND SWITCHING REGULATOR

CROSS REFERENCE TO RELATED APPLICATIONS

This application is a Continuation of U.S. patent application Ser. No. 15/278,198 filed Sep. 28, 2016, which claims benefit of priority to Japanese Patent Application 2015-197028 filed Oct. 2, 2015, the entire content of which is incorporated herein by reference.

TECHNICAL FIELD

The present disclosure relates to an inductor component, a package component, and a switching regulator.

BACKGROUND

An inductor component described in Japanese Patent Publication No. 2013-225718 has traditionally been present. This inductor component includes a glass epoxy substrate, spiral wires disposed on both sides of the glass epoxy substrate, insulating resins that each cover the spiral wire, and cores that cover the insulating resin thereon and thereebeneath. The core is a metal magnetic powder-including resin and the core includes metal magnetic powder whose average particle diameter is 20 to 50 μm.

SUMMARY

Problems to be Solved by the Disclosure

Electric-power saving techniques are increasingly demanded with the improvement of the performance of PCs and servers, and the prevalence of mobile devices. In this situation, an IVR (Integrated Voltage Regulator) technique attracts attention as a technique of reducing the power consumption of a CPU (Central Processing Unit).

In a traditional system, as depicted in FIG. 12, a voltage is supplied from a power source 105 to N CPUs 101 in an IC (Integrated Circuit) chip 100 through one VR (Voltage Regulator) 103.

On the other hand, in a system employing the IVR technique, as depicted in FIG. 13, an individual VR 113 regulating the voltage from the power source 105 is disposed for each of the CPUs 101, and the voltage supplied to the CPU 101 is individually controlled corresponding to the clock operation frequency of the CPU 101.

The supplied voltage needs to be varied at a high speed to control the supplied voltage to correspond to the variation of the operation frequency of the CPU 101, and the VR 113 needs a chopper circuit that executes a high speed switching operation at a frequency such as 10 to 100 MHz.

Associated with this, a high frequency power inductor is also needed that can cope with the high speed switching operation at the frequency such as 10 to 100 MHz and that can energize at a level of several A as a sufficient current to the core during the operation of the CPU 101, as the inductor used in a ripple filter on the output side of the chopper circuit.

Additionally, the IVR also aims at facilitating downsizing simultaneously with the electric-power saving by integrating the above system with the IC chip 110, and a small-size high frequency power inductor capable of being incorporated in the IC package is demanded. Especially, downsizing of the system is advanced by using three-dimensional mounting such as SiP (System in Package) or PoP (Package on Package) and, in this situation, a thin-type high frequency power inductor having a thickness, for example, equal to or smaller than 0.33 mm is needed that can be incorporated in an IC package substrate or that can be mounted on a BGA (Ball Grid Array) side of the substrate.

Because the traditional inductor component has the spiral wires disposed on both of the sides of the glass epoxy substrate, the thickness of the glass epoxy substrate however acts as an obstructive factor and the reduction of the thickness thereof is difficult. The glass epoxy substrate has the thickness of at least about 80 μm due to the limit of the thickness of the glass cloth and the interlayer pitch of the spiral wires in the two layers cannot therefore be reduced any more. When the thickness of this substrate is forcibly reduced, the strength of the substrate cannot be maintained, and wire processing and the like become difficult.

Because the core includes the metal magnetic powder whose average particle diameter is 20 to 50 μm, the size of the metal magnetic powder is large. The thickness of each of the cores on and beneath the insulating resin is thereby increased and reduction of the thickness is difficult. For example, to include the metal magnetic powder in the insulating resin that covers each of the spiral wires to improve the L-value, the wire pitch needs to be secured to be sufficiently larger than the average particle diameter of the metal magnetic powder and downsizing is also difficult.

Because the size of the metal magnetic powder is large, the eddy current loss is large in the metal magnetic powder and, in the high speed switching operation at a frequency such as 50 MHz to 100 MHz, the loss is large and the high frequency is difficult to be supported.

An object of the present disclosure is to provide an inductor component that can support any high frequency and maintains the strength thereof and that can facilitate reduction of the height and downsizing.

Solutions to the Problems

To achieve the object, the inductor component of the present disclosure includes:
a composite body that includes a plurality of composite layers each including a composite material of an inorganic filler and a resin; and
a plurality of spiral wires that each are stacked on the composite layer, the spiral wires each being covered with the other composite layer, wherein
the average particle diameter of the inorganic filler is equal to or smaller than 5 μm,
the wire pitch of the spiral wires is equal to or smaller than 10 μm, and
the interlayer pitch between adjacent spiral wires is equal to or smaller than 10 μm.

According to the inductor component of the present disclosure, the spiral wires are each stacked on the composite layer that includes the composite material of the inorganic filler and the resin. As to the composite layer, any physical defect such as a crack is not generated therein even when the composite layer is formed to be a thin film, a sufficient strength thereof can be maintained even when the composite layer is not disposed on a glass epoxy substrate or the like, and reduction of the height can be facilitated by excluding the thickness of the glass epoxy substrate.

Because the average particle diameter of the inorganic filler is equal to or smaller than 5 μm, the wire pitch and the interlayer pitch of the spiral wires can be reduced and, because the wire pitch and the interlayer pitch of the spiral wires are each equal to or smaller than 10 µm, reduction of the height and downsizing can be facilitated.

Because the average particle diameter of the inorganic filler is equal to or smaller than 5 µm, when the inorganic filler is a magnetic substance, the eddy current loss in the magnetic substance is small and, even for a high speed switching operation at a frequency such as 50 MHz to 100 MHz, the loss is small and the high frequency can be supported.

The high frequency can be supported and reduction of the height and downsizing can be facilitated, maintaining the strength.

In one embodiment of the inductor component, the composite body includes a magnetic composite body whose inorganic filler includes a metal magnetic material.

According to the embodiment, because the composite body includes the magnetic composite body, even when the inorganic filler is formed to be fine particles having the average particle size equal to or smaller than 5 µm, high magnetic permeability can be secured and the Q-value of the inductor at a high frequency can be increased.

In one embodiment of the inductor component, the composite body includes an insulating composite body that covers the spiral wire, the inorganic filler being an insulating substance; and
the magnetic composite body covers the insulating composite body.

According to the embodiment, because the composite body includes the insulating composite body and the magnetic composite body, the insulating composite body improves the insulation between the wires and between the layers of the spiral wires and enables further downsizing and reduction of the height or reduction of the resistance of the spiral wires, and the Q-value at the high frequency can be maintained. With the magnetic composite body, a high inductance value can be acquired.

In one embodiment of the inductor component, the inorganic filler of the insulating composite body is $SiO_2$ whose average particle diameter is equal to or smaller than 0.5 µm.

According to the embodiment, because the inorganic filler of the insulating composite body is $SiO_2$ whose average particle diameter is equal to or smaller than 0.5 µm, the insulation between the wires and between the layers of the spiral wires can be enhanced, and downsizing and reduction of the height can further be facilitated.

In one embodiment of the inductor component, the content rate of the inorganic filler in the insulating composite body is equal to or higher than 20 Vol % and equal to or lower than 70 Vol % relative to the insulating composite body.

According to the embodiment, because the content rate of the inorganic filler is equal to or higher than 20 Vol % and equal to or lower than 70 Vol %, the fluidity and the linear expansion coefficient of the composite body can be set to be adequate, and downsizing and reduction of the height, and improvement of the reliability and the insulation can concurrently be established.

In one embodiment of the inductor component, the inorganic filler of the magnetic composite body is an FeSi-based alloy, an FeCo-based alloy, an FeNi-based alloy, or an amorphous alloy of these alloys, having the average particle diameter that is equal to or smaller than 5 µm.

According to the embodiment, because the inorganic filler of the magnetic composite body is an FeSi-based alloy, an FeCo-based alloy, an FeNi-based alloy, or an amorphous alloy of these alloys, having the average particle diameter that is equal to or smaller than 5 µm, the Q-value of the inductor at a high frequency can be increased.

In one embodiment of the inductor component, the content rate of the inorganic filler in the magnetic composite body is equal to or higher than 20 Vol % and equal to or lower than 70 Vol % relative to the magnetic composite body.

According to the embodiment, because the content rate of the inorganic filler is equal to or higher than 20 Vol % and equal to or lower than 70 Vol %, the fluidity and the linear expansion coefficient are set to be adequate, and downsizing and reduction of the height and high reliability, and a high Q-value at a high frequency can concurrently be established.

In one embodiment of the inductor component, the number of turns of the inductor including the spiral wires is equal to or smaller than 10.

According to the embodiment, because the number of turns of the inductor including the spiral wires is equal to or smaller than 10, downsizing can be facilitated securing an L-value necessary during a high speed switching operation.

In one embodiment of the inductor component, the thickness of a composite body positioned in an upper portion of the spiral wires in a stacking direction and the thickness of a composite body positioned in a lower portion of the spiral wires in the stacking direction are equal to each other and are each equal to or larger than 10 µm and equal to or smaller than 50 µm.

According to the embodiment, because the thickness of the composite body in the upper portion and the thickness of the composite body in the lower portion are equal to each other and are each equal to or larger than 10 µm and equal to or smaller than 50 µm, the L-value necessary in a high speed switching operation can be acquired with a small thickness and reduction of the thickness can be facilitated.

In one embodiment of the inductor component, the inductor component further includes a pair of external terminals that are disposed at least one of over or under the spiral wires in the stacking direction, the pair of external terminals being electrically connected to the spiral wires, and wherein end faces of the pair of external terminals in the stacking direction are positioned in the same plane as that of an end face of the composite body in the stacking direction.

The external terminals in this case refer to wires such as Cu wires and do not include any plating that covers the wires.

According to the embodiment, because the end faces of the pair of external terminals are positioned in the same plane as that of the end face of the composite body, the external terminals do not protrude from the end face of the composite body and reduction of the height can be facilitated.

In one embodiment of the inductor component, the pair of external terminals is buried in the composite body.

According to the embodiment, because the external terminals are buried in the composite body, downsizing can be facilitated. The external terminals can be disposed at arbitrary positions on the end face of the composite body in the stacking direction and the degree of freedom is increased for the designing of the layout of the wires and terminals to be connected.

In one embodiment of the inductor component, one of the pair of external terminals is disposed both over and under the spiral wires in the stacking direction, and the upper and the lower external terminals are electrically connected to each other, and the other of the pair of external terminals is disposed at least over the spiral wires in the stacking direction.

According to the embodiment, because the one of the pair of external terminals is disposed both over and under the spiral wires in the stacking direction, wires conductive for the upper and the lower external terminals can therefore be disposed on the upper and the lower faces of the substrate when the inductor component is buried in the substrate. The output side of a chopper circuit can be connected in the shortest course by the upper and the lower external terminals that are electrically connected to each other, without running any more wire around. The ESR and the ESL of a smoothing capacitor on the output side can therefore be reduced and the ripple voltage of the output can be reduced.

In one embodiment of the package component, the package component includes:
- a substrate; and
- the inductor component that is buried in the substrate, wherein
- the external terminals on an upper side of the inductor component is disposed at a side of an upper face of the substrate, and the external terminal on a lower side of the inductor component is disposed at a side of a lower face of the substrate, and wherein
- wires each electrically connected to the external terminal on the upper side are disposed on the upper face of the substrate and a wire electrically connected to the external terminal on the lower side is disposed on the lower face of the substrate.

According to the embodiment, the inductor component is buried in the substrate, a wire electrically connected to the external terminal on the upper side is disposed on the upper face of the substrate, and a wire electrically connected to the external terminal on the lower side is disposed on the lower face of the substrate. The output side of the chopper circuit can be connected in the shortest course by the upper and the lower external terminals electrically connected to each other, without running any more wire around. The ESR and the ESL of the smoothing capacitor on the output side can therefore be reduced and the ripple voltage of the output can be reduced.

In one embodiment of a switching regulator, the switching regulator includes:
- the package component;
- a switching element that opens or closes electric connection between an external power source and the inductor component; and
- a smoothing capacitor that smoothes an output voltage from the inductor component, wherein
- the switching element is disposed on a side of the upper face of the substrate of the package component, and is electrically connected to the wire connected to the other of the pair of external terminals,
- the smoothing capacitor is disposed on a side of the lower face of the substrate in the package component and is electrically connected to the wire on the lower side of the wires connected to the one of the pair of external terminals, and
- the wire on the upper side of the wires connected to the one of the pair of external terminals is an output terminal.

According to the embodiment, the smoothing capacitor is connected to the wire on the lower face of the substrate of the package component, and the side of the output terminal connected to a load such as a central processing unit is connected to the wire on the upper face of the substrate of the package component similarly to the switching element. The inductor component of the package component, and the load and the smoothing capacitor can thereby be connected in the shortest course using the upper and the lower external terminals, without running any more wire around. The ESR and the ESL of the smoothing capacitor can therefore be reduced and the ripple voltage of the output can be reduced.

Effect of the Disclosure

According to the inductor component of the present disclosure, a high frequency can be supported and reduction of the height and downsizing can be facilitated, maintaining the strength.

BRIEF DESCRIPTION OF THE DRAWINGS

FIG. 11A is a cross-sectional diagram of a first embodiment of a switching regulator of the present disclosure.

DETAILED DESCRIPTION

The present disclosure will be described in detail with reference to depicted embodiments.

First Embodiment

Figure 1A:
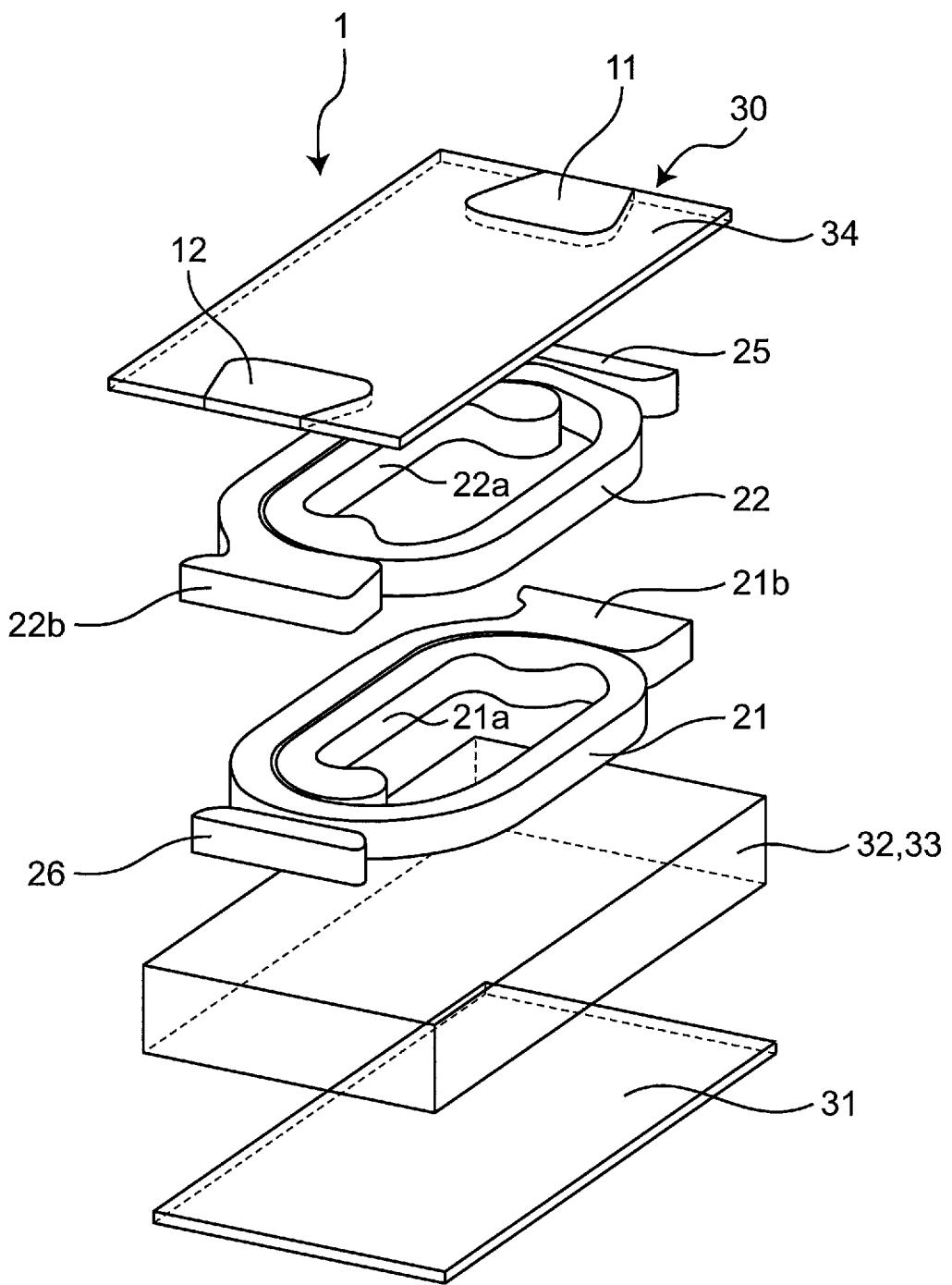
FIG. 1A is an exploded perspective diagram of a first embodiment of an inductor component of the present disclosure.

FIG. 1A is an exploded perspective diagram of the first embodiment of an inductor component of the present disclosure.

Figure 1B:
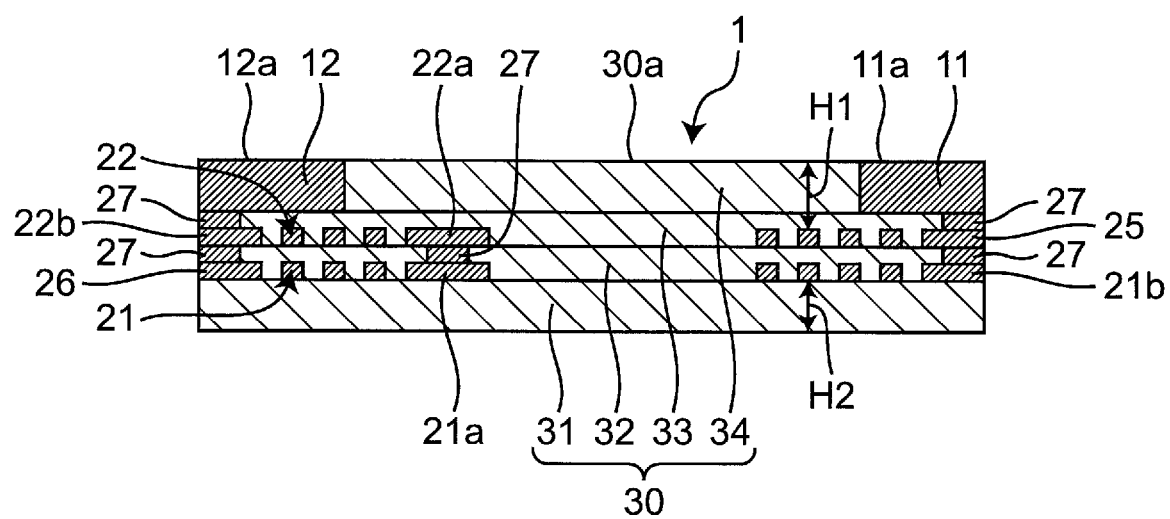
FIG. 1B is a cross-sectional diagram of the inductor component.

FIG. 1B is a cross-sectional diagram of the inductor component. The drawings are schematic, and the relationship among the scales and dimensions of members may be different from the actual relationship thereamong. As depicted in FIG. 1A and FIG. 1B, the inductor component 1 is mounted on an electronic apparatus such as, for example, a personal computer, a DVD player, a digital camera, a television, a mobile phone, or automotive electronics.

The inductor component 1 includes two layers of spiral wires 21 and 22, a magnetic composite body 30 (to be an example of a composite body) that covers the two layers of spiral wires 21 and 22. "Covering an object" used herein refers to covering at least a portion of the object. In FIG. 1A, in the magnetic composite body 30, portions 32 and 33 to have the spiral wires 21 and 22 buried therein are depicted integral with each other.

The first and the second spiral wires 21 and 22 are sequentially disposed from a lower layer to an upper layer. The description will be made herein assuming that the up-and-down direction of the inductor component 1 matches with the up-and-down direction of the page carrying FIG. 1B thereon. The first and the second spiral wires 21 and 22 are electrically connected in the stacking direction. The "stacking direction" refers to a direction for the layers to be stacked and means, for example, a direction along the up-and-down direction of the page carrying FIG. 1B thereon. The first and the second spiral wires 21 and 22 are each formed in a spiral shape in a plane. The first and the second spiral wires 21 and 22 each include a low resistance metal such as, for example, Cu, Ag, or Au. Preferably, a low-resistance and narrow-pitch spiral wire can be formed by using Cu plating formed using a semi-additive process.

External terminals 11 and 12 are disposed above the first and the second spiral wires 21 and 22 in the stacking direction. The first external terminal 11 is electrically connected to the first spiral wire 21 and the second external terminal 12 is electrically connected to the second spiral wire 22. The external terminals 11 and 12 each include, for example, the same material as that of the spiral wires 21 and 22. The external terminals 11 and 12 refer to wires such as Cu wires and do not include any plating that covers the wires.

The magnetic composite body 30 includes first to fourth composite layers 31 to 34. The first to the fourth composite layers 31 to 34 are sequentially disposed from a lower layer to an upper layer. The magnetic composite body 30 includes a composite material of an inorganic filler and a resin. The resin is an organic insulating material including, for example, an epoxy-based resin, bismaleimide, a liquid crystal polymer, polyimide, or the like. The average particle diameter of the inorganic filler is equal to or smaller than 5 μm. The "average particle diameter" used herein refers to the particle diameter that corresponds to 50% of the integrated value in the grain size distribution acquired using a laser diffraction and scattering method. The inorganic filler is a magnetic substance. The inorganic filler is, for example, an FeSi-based alloy such as FeSiCr, an FeCo-based alloy, an Fe-based alloy such as NiFe, or an amorphous alloy of these alloys, having an average particle diameter that is equal to or smaller than 5 μm. Preferably, the content rate of the inorganic filler is equal to or higher than 20 Vol % and equal to or lower than 70 Vol % relative to the magnetic composite body 30.

The first spiral wire 21 is stacked on the first composite layer 31. The second composite layer 32 is stacked on the first spiral wire 21 and covers the first spiral wire 21. The second spiral wire 22 is stacked on the second composite layer 32. The third composite layer 33 is stacked on the second spiral wire 22 and covers the second spiral wire 22. The fourth composite layer 34 is stacked on the third composite layer 33. In this manner, each of the first and the second spiral wires 21 and 22 is stacked on the composite layer and is covered by the other composite layer that is an upper layer. The magnetic composite body 30 is also disposed in an inner diameter portion of each of the first and the second spiral wires 21 and 22 that correspond to inner magnetic paths.

The first and the second spiral wires 21 and 22 are disposed centering the same one axis. The first spiral wire 21 and the second spiral wire 22 are wound in the same one direction, seen from the axis direction (the stacking direction).

The second spiral wire 22 is electrically connected to the first spiral wire 21 through a via wire 27 that extends in the stacking direction. Another via wire 27 is also disposed in the second composite layer 32. An inner circumference part 21a of the first spiral wire 21 and an inner circumference part 22a of the second spiral wire 22 are electrically connected to each other through the via wires 27. The first spiral wire 21 and the second spiral wire 22 thereby constitute one inductor.

An outer circumference part 21b of the first spiral wire 21 and an outer circumference part 22b of the second spiral wire 22 are positioned on the sides of both ends of the magnetic composite body 30, seen from the stacking direction. The first external terminal 11 is positioned on the side of the outer circumference part 21b of the first spiral wire 21 and the second external terminal 12 is positioned on the side of the outer circumference part 22b of the second spiral wire 22.

The outer circumference part 21b of the first spiral wire 21 is electrically connected to the first external terminal 11 through the via wire 27 that is disposed in the second composite layer 32, a first connection wire 25 that is disposed on the second composite layer 32, and the via wire 27 that is disposed in the third composite layer 33. The outer circumference part 22b of the second spiral wire 22 is electrically connected to the second external terminal 12 through the via wire 27 that is disposed in the third composite layer 33. The outer circumference part 22b of the second spiral wire 22 is electrically connected to a second connection wire 26 that is disposed on the first composite layer 31 through the via wire 27 that is disposed in the second composite layer 32.

The thickness in the height direction of each of the first and the second spiral wires 21 and 22 is equal to or larger than 40 µm and, preferably, is equal to or smaller than 120 µm. The "height direction" is the direction along the up-and-down direction of the inductor component 1. The wire pitch of each of the first and the second spiral wires 21 and 22 is equal to or smaller than 10 µm and, preferably, is equal to or larger than 3 µm. The interlayer pitch between adjacent the spiral wires 21 and 22 is equal to or smaller than 10 µm and, preferably, is equal to or larger than 3 µm. The wire pitch and the interlayer pitch are designed values and the manufacture dispersion thereof is about ±20%.

The DC resistance can sufficiently be reduced by setting the wire thickness to be equal to or larger than 40 µm. The wire aspect to be the ratio of the thickness in the height direction to that in the width direction of the wire is prevented from becoming extremely high by setting the wire thickness to be equal to or smaller than 120 µm, and any process dispersion can thereby be suppressed. The wire width can be taken to be large by setting the wire pitch to be equal to or smaller than 10 µm, and the DC resistance can thereby be reliably reduced. The insulation between the wires can sufficiently be secured by setting the wire pitch to be equal to or larger than 3 µm. The height can be reduced by setting the interlayer pitch to be equal to or smaller than 10 µm. Any interlayer short-circuiting can be suppressed by setting the interlayer pitch to be equal to or larger than 3 µm.

The number of turns of the inductor including the first and the second spiral wires 21 and 22 is equal to or greater than one and equal to or smaller than 10 and is, preferably, equal to or smaller than 1.5 to 5. In this embodiment, the number of turns is 2.5.

The thickness H1 of the magnetic composite body 30 positioned in the upper portion of the second spiral wire 22 in the stacking direction and the thickness H2 of the magnetic composite body 30 positioned in the lower portion of the first spiral wire 21 in the stacking direction are equal to each other and are each equal to or larger than 10 µm and equal to or smaller than 50 µm. "Being equal" herein includes being substantially equal in addition to being completely equal.

Upper end faces 11a and 12a of the first and the second external terminals 11 and 12 in the stacking direction are positioned in the same plane as that of an upper end face 30a of the magnetic composite body 30 in the stacking direction. The first and the second external terminals 11 and 12 are buried in the magnetic composite body 30. The upper end faces 11a and 12a of the first and the second external terminals 11 and 12 in the stacking direction may be covered with SnNi plating to improve the solder wettability thereof for the solder mounting.

A manufacture method of the inductor component 1 will be described.

Figure 2A:
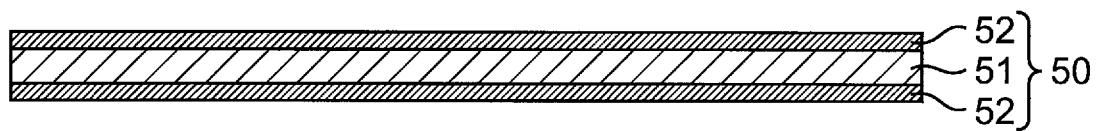
FIG. 2A is a diagram for explaining a manufacture method of the inductor component.

As depicted in FIG. 2A, a base platform 50 is prepared. The base platform 50 includes an insulating substrate 51 and base metal layers 52 disposed on both faces of the insulating substrate 51. In this embodiment, the insulating substrate 51 is a glass epoxy substrate and the base metal layer 52 is a Cu foil sheet. The thickness of the base platform 50 does not influence the thickness of the inductor component 1 and any base platform 50 having a thickness suitable for easy handling may properly be used because of the reasons such as warpage generated in the processing.

Figure 2B:
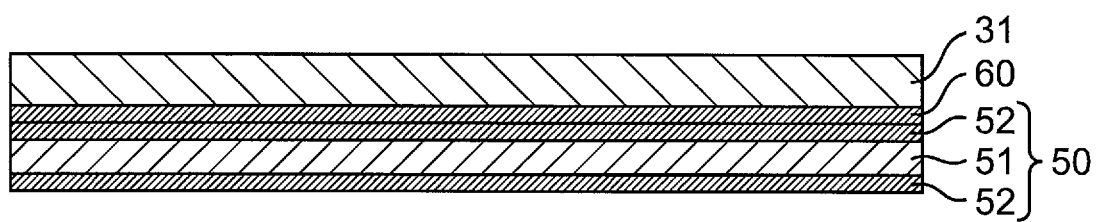
FIG. 2B is a diagram for explaining the manufacture method of the inductor component.

As depicted in FIG. 2B, a dummy metal layer 60 is bonded to one face of the base platform 50. In this embodiment, the dummy metal layer 60 is a Cu foil sheet. Because the dummy metal layer 60 is bonded to the base metal layer 52 of the base platform 50, the dummy metal layer 60 is bonded to a smooth face of the base metal layer 52. The adhesive force between the dummy metal layer 60 and the base metal layer 52 can therefore be weakened and, in the post-process, the base platform 50 can therefore be easily peeled off from the dummy metal layer 60. Preferably, the adhesive bonding the base platform 50 and the dummy metal layer 60 to each other is a low adhesion adhesive. To weaken the adhesive force between the base platform 50 and the dummy metal layer 60, the bonding surface of each of the base platform 50 and the dummy metal layer 60 is advantageously set to be a glossy surface.

The first composite layer 31 is thereafter stacked on the dummy metal layer 60 that is temporarily bonded to the base platform 50. In this case, the first composite layer 31 is thermally compressed and thermally cured using a vacuum laminator, a pressing machine, or the like.

Figure 2C:
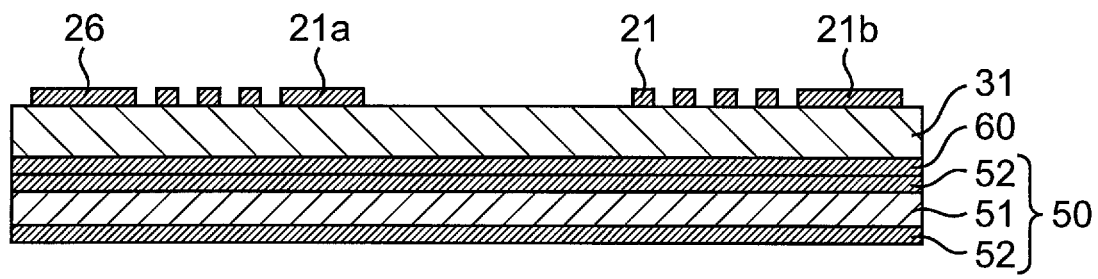
FIG. 2C is a diagram for explaining the manufacture method of the inductor component.

As depicted in FIG. 2C, the first spiral wire 21 and the second connection wire 26 are stacked on the first composite layer 31. The first spiral wire 21 and the second connection wire 26 are not in contact with each other. The second connection wire 26 is disposed on a side opposite to that of the outer circumference part 21b. For example, a power supply film for the SAP (Semi Additive Process) is disposed on the first composite layer 31 using electroless plating, sputtering, vapor deposition, or the like. After disposing the power supply film, a photosensitive resist is applied or attached to the power supply film and a wire pattern is formed using photolithography. Metal wires corresponding to the wires 21 and 22 are thereafter disposed using the SAP. After disposing the metal wires, the photosensitive resist is peeled and removed using a chemical solution and the power supply film is removed by etching. Additional Cu electrolytic plating is thereafter applied using the metal wires as a power supply part, and the wires 21 and 22 each having a narrower space can thereby be acquired. In this embodiment, a Cu wire having L (the wire width)/S (the wire space (the wire pitch))/t (the wire thickness) to be 50/30/60 µm is disposed using the SAP and a wire having L/S/t=70/10/70

μm can thereafter be acquired by executing additional Cu electrolytic plating therefor that corresponds to the thickness of 10 μm.

Figure 2D:
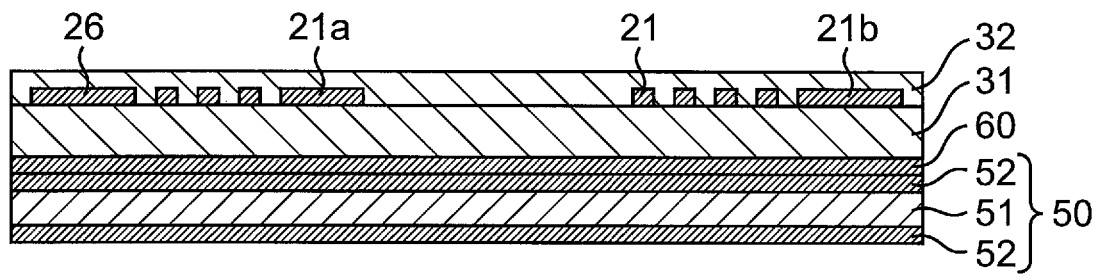
FIG. 2D is a diagram for explaining the manufacture method of the inductor component.

As depicted in FIG. 2D, the second composite layer 32 is stacked on the first spiral wire 21 to cover the first spiral wire 21 with the second composite layer 32. The second composite layer 32 is thermally compressed and thermally cured using a vacuum laminator, a pressing machine, or the like. In this case, the thickness of the second composite layer 32 above the first spiral wire 21 is set to be equal to or smaller than 10 μm. The interlayer pitch of the first and the second spiral wires 21 and 22 can thereby be set to be equal to or smaller than 10 μm.

To secure the filling into the wire pitch (for example, 10 μm) of the first spiral wire 21, the inorganic filler (magnetic substance powder) included in the second composite layer 32 needs to have the particle diameter that is sufficiently smaller than the wire space of the first spiral wire 21. To realize the reduction of the thickness of the component, the interlayer pitch for the continued wire in the upper portion needs to be reduced to be equal to or smaller than, for example, 10 μm and the magnetic substance powder therefore also needs to have a particle diameter that is sufficiently small.

Figure 2E:
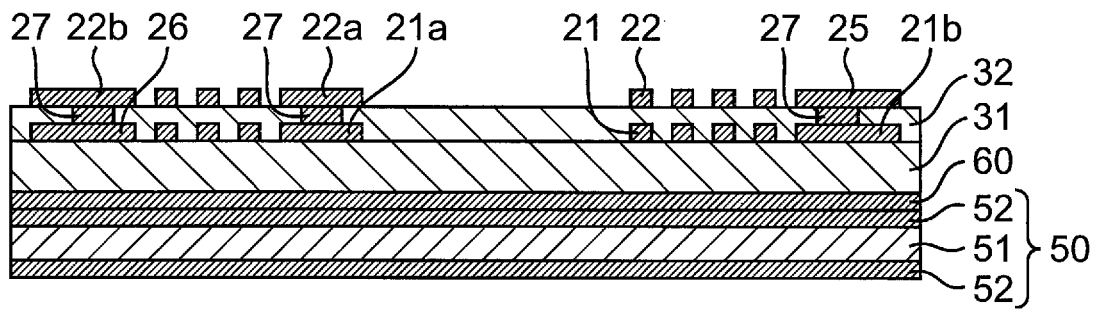
FIG. 2E is a diagram for explaining the manufacture method of the inductor component.

As depicted in FIG. 2E, via holes to be filled with the via wires 27 are disposed in the second composite layer 32 using laser processing or the like. The via holes are thereafter filled with the via wires 27, and the second spiral wire 22 and the first connection wire 25 are stacked on the second composite layer 32. The second spiral wire 22 and the first connection wire 25 are not in contact with each other. The first connection wire 25 is disposed on a side opposite to that of the outer circumference part 22b. In this case, the via wires 27, the second spiral wire 22, and the first connection wire 25 can be disposed using the same process as that used for the first spiral wire 21.

Figure 2F:
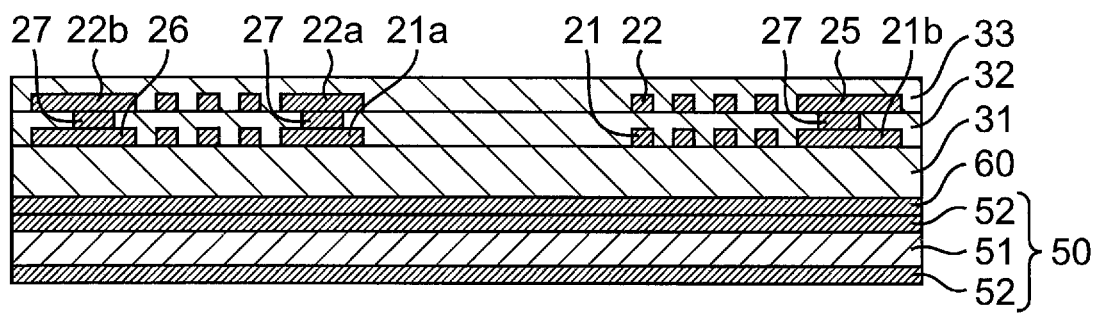
FIG. 2F is a diagram for explaining the manufacture method of the inductor component.

As depicted in FIG. 2F, the third composite layer 33 is stacked on the second spiral wire 22 to cover the second spiral wire 22 with the third composite layer 33. The third composite layer 33 is thermally compressed and thermally cured using a vacuum laminator, a pressing machine, or the like.

Figure 2G:
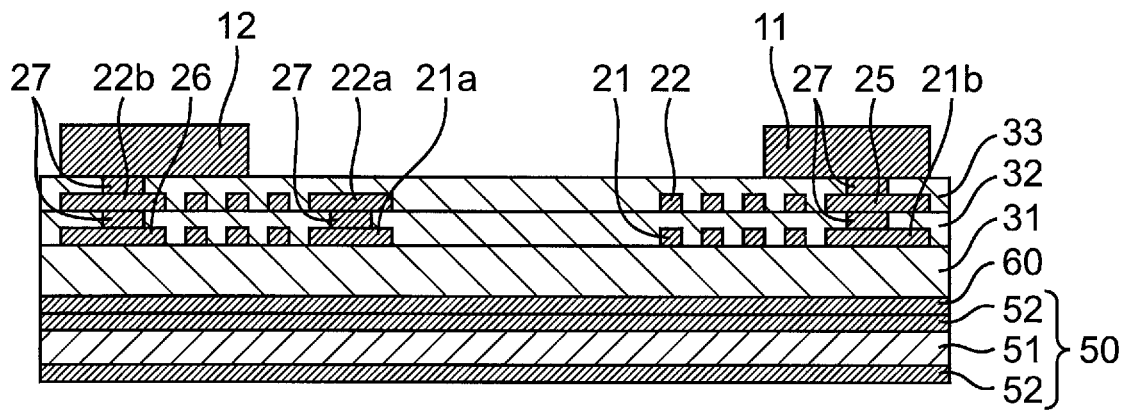
FIG. 2G is a diagram for explaining the manufacture method of the inductor component.

As depicted in FIG. 2G, the via holes to be filled with the via wires 27 are disposed in the third composite layer 33 using laser processing or the like. The via holes are thereafter filled with the via wires 27, and the first and the second external terminals 11 and 12 each having a columnar shape are stacked on the third composite layer 33. In this case, the via wires 27, and the first and the second external terminals 11 and 12 can be disposed using the same process as that used for the first spiral wire 21.

Figure 2H:
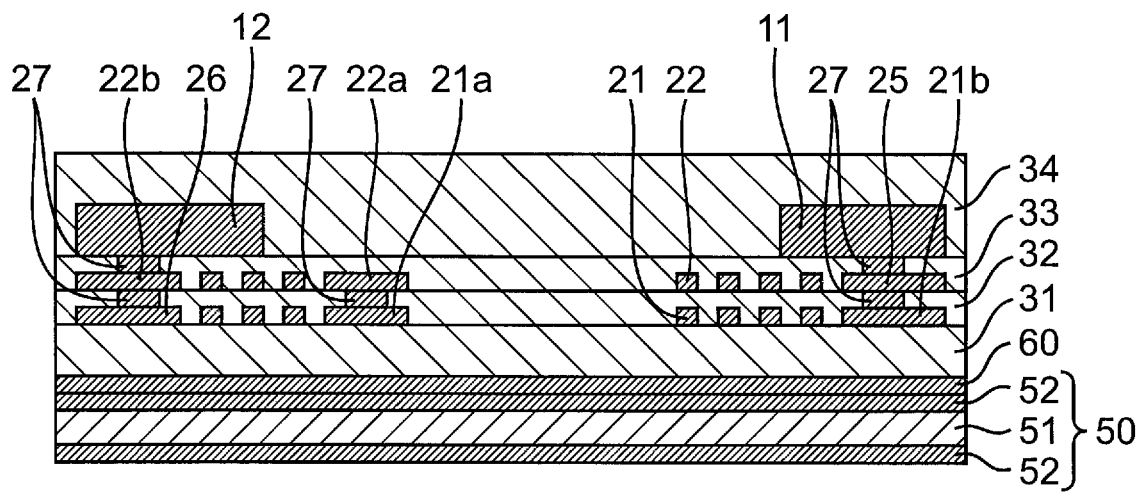
FIG. 2H is a diagram for explaining the manufacture method of the inductor component.

As depicted in FIG. 2H, the fourth composite layer 34 is stacked on the first and the second external terminals 11 and 12 to cover the first and the second external terminals 11 and 12 with the fourth composite layer 34. The fourth composite layer 34 is thermally compressed and thermally cured using a vacuum laminator, a pressing machine, or the like.

Figure 2I:
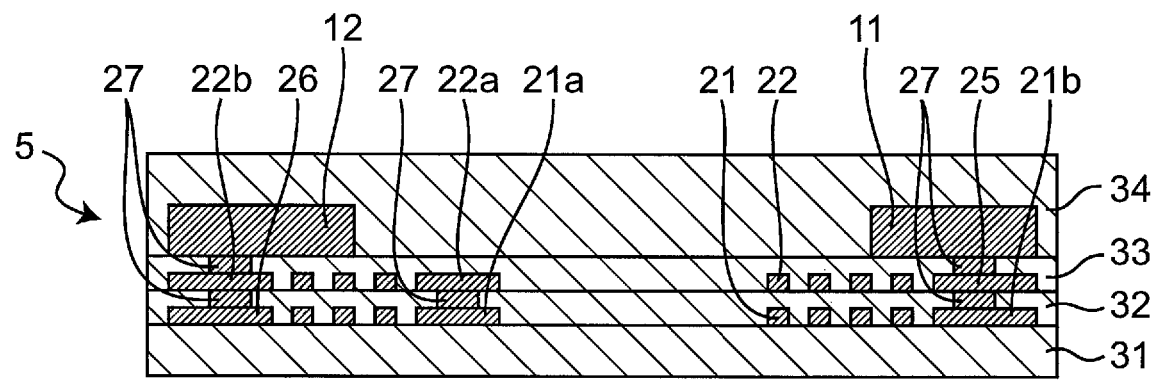
FIG. 2I is a diagram for explaining the manufacture method of the inductor component.

The base platform 50 is peeled off from the dummy metal layer 60 in the adhesion surface between the one face of the base platform 50 (the base metal layer 52) and the dummy metal layer 60. The dummy metal layer 60 is removed by etching or the like and, as depicted in FIG. 2I, an inductor substrate 5 is formed.

Figure 2J:
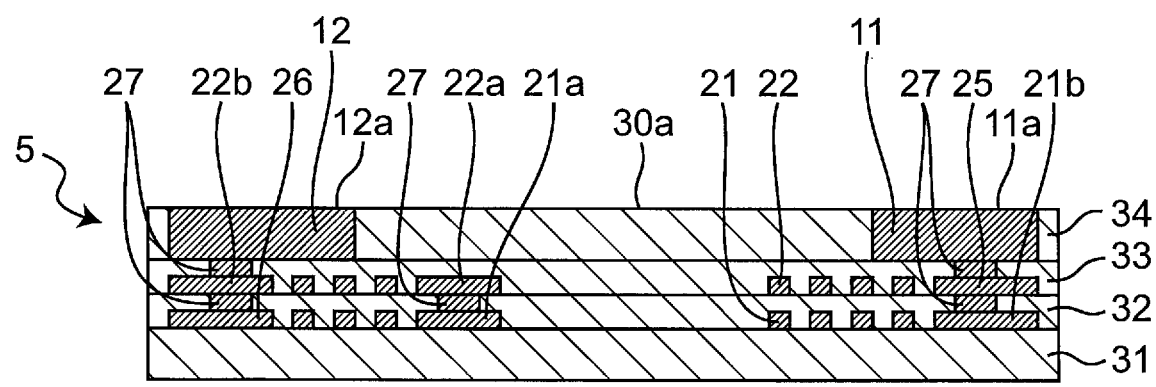
FIG. 2J is a diagram for explaining the manufacture method of the inductor component.

As depicted in FIG. 2J, the fourth composite layer 34 to be the uppermost layer of the inductor substrate 5 is processed to be a thin film using a grinding process. At this time, a portion of each of the first and the second external terminals 11 and 12 is exposed and upper end faces 11a and 12a of the first and the second external terminals 11 and 12 are thereby positioned in the same plane as that of the upper end face 30a of the magnetic composite body 30. In this case, reduction of the thickness of the component can be facilitated by grinding the fourth composite layer 34 to have a thickness that is sufficient to be able to acquire an inductance value. In this embodiment, the thickness of the magnetic composite body 30 positioned in the upper portion of the second spiral wire 22 in the stacking direction (corresponding to the thickness H1 of FIG. 1B) can be set to be 40 μm.

The inductor substrate 5 is thereafter divided into individual chips by dicing and scribing to form the inductor components 1 each depicted in FIG. 1B. After the division into individual chips, a plating film of NiSn or the like may be disposed on the first and the second external terminals 11 and 12 using a method such as barrel plating to enhance the mounting property.

Though the inductor substrate 5 is formed on one face of both faces of the base platform 50, the inductor substrate 5 may be formed on each of both faces of the base platform 50. High productivity can thereby be achieved.

According to the inductor component 1, because the first and the second spiral wires 21 and 22 are stacked on the composite layer of the magnetic composite body 30, any physical defect such as a crack is not generated in the composite layer even when the composite layer is formed to be a thin film, a sufficient strength thereof can be maintained even when the composite layer is not disposed on the glass epoxy substrate or the like, and reduction of the height can be facilitated by excluding the thickness of the glass epoxy substrate.

Because the average particle diameter of the inorganic filler of the magnetic composite body 30 is equal to or smaller than 5 μm, the wire pitch and the interlayer pitch of the first and the second spiral wires 21 and 22 can be reduced and, because the wire pitch and the interlayer pitch of the first and the second spiral wires 21 and 22 are each equal to or smaller than 10 μm, reduction of the height and downsizing can be facilitated.

Because the average particle diameter of the inorganic filler to be a magnetic substance is equal to or smaller than 5 μm, the eddy current loss in the magnetic substance is small, the loss is small for a high speed switching operation at a frequency such as 50 MHz to 100 MHz, and the support for the high frequency is enabled.

Because the magnetic composite body 30 includes the composite material of the inorganic filler and the resin, any physical defect such as a crack is not generated therein even when the height thereof is reduced.

The high frequency can be supported, and reduction of the height and downsizing can be facilitated maintaining the strength.

According to the inductor component 1, because the composite body includes the magnetic composite body 30, high magnetic permeability can be secured and the Q-value of the inductor at a high frequency can be increased even when the average particle diameter of the inorganic filler of the magnetic substance is set to be equal to or smaller than 5 μm to be fine particles.

According to the inductor component 1, because the inorganic filler of the magnetic composite body 30 is an FeSi-based alloy, an FeCo-based alloy, or an amorphous alloy of these alloys, having the average particle diameter equal to or smaller than 5 μm, the Q-value of the inductor at a high frequency can be increased.

Using an Fe-based material as the inorganic filler provides a higher magnetic moment compared to that of any other soft magnetic material and, even when the particle diameter is reduced, a relatively high magnetic permeability can be acquired. The surface of the inorganic filler may be treated to be insulative using phosphate treatment, silica coating, or the like to enhance the insulation of the magnetic composite body 30. The high frequency performance is degraded due to the eddy current loss when the insulation of the surface is low.

Figure 3:
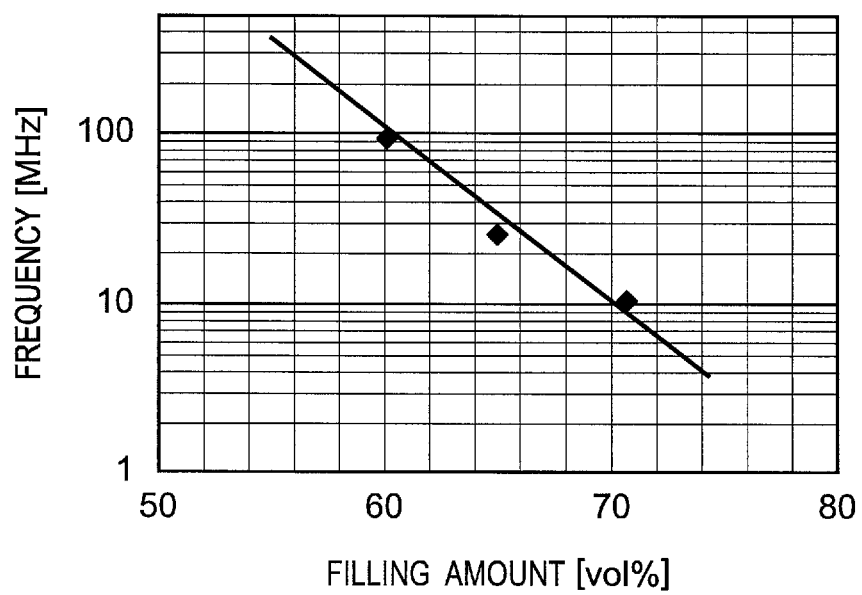
FIG. 3 is a graph of a frequency property of a composite body to a filling amount of an inorganic filler.

According to the inductor component 1, because the content rate of the inorganic filler is equal to or higher than 20 Vol % and equal to or lower than 70 Vol %, the fluidity and a high Q-value can concurrently be established. FIG. 3 is a graph of a frequency property to a filling amount (the content rate) of the inorganic filler. FIG. 3 depicts an approximate straight line acquired when frequencies (MHz) are plotted that are each acquired when the dielectric tangent (tan δ) is 0.01 with a filling amount (Vol %) of the inorganic filler.

The filling amount (the content rate) is represented by {the volume of the inorganic filler/(the volume of the inorganic filler+the volume of the resin)}×100. For example, this complies with JIS K 7250 (2006) "Plastic-How to Determine Ash Percentage". Otherwise, simply, the three-dimensional dispersion state of the filler is acquired by executing SEM observation in the depth direction using an FIB-SEM. This data is the data acquired using an FIB-SEM.

As depicted in FIG. 3, any loss can be suppressed even for a high speed switching operation at an operation frequency of 10 MHz and the property can be maintained even at a high frequency by setting the content rate of the inorganic filler to be equal to or lower than 70 Vol %. The content rate of the inorganic filler is, preferably, equal to or lower than 65 Vol % and, especially, is, more preferably, equal to lower than 60 Vol %. From FIG. 3, any loss can be suppressed for a high speed switching operation at a frequency up to 50 MHz when the content rate is equal to or lower than 65 Vol % and up to 100 MHz when the content rate is equal to or lower than 60 Vol %, and the property can be maintained at a high frequency.

Preferably, the content rate of the inorganic filler is equal to higher than 20 Vol % and, in this case, the fluidity and the linear expansion coefficient of the composite body can adequately be secured and a composite body can be acquired whose downsizing, height reduction, and reliability improvement can be facilitated.

According to the inductor component 1, because the number of turns of the inductor including the first and the second spiral wires 21 and 22 is equal to or smaller than 10, downsizing can be facilitated securing the L-value necessary for a high speed switching operation.

According to the inductor component 1, because the thickness H1 of the magnetic composite body 30 in the upper portion and the thickness H2 of the magnetic composite body 30 in the lower portion are equal to each other and are each equal to or larger than 10 μm and equal to or smaller than 50 μm, the L-value necessary for a high speed switching operation can be acquired with a small thickness and reduction of the thickness can be facilitated.

Figure 4:
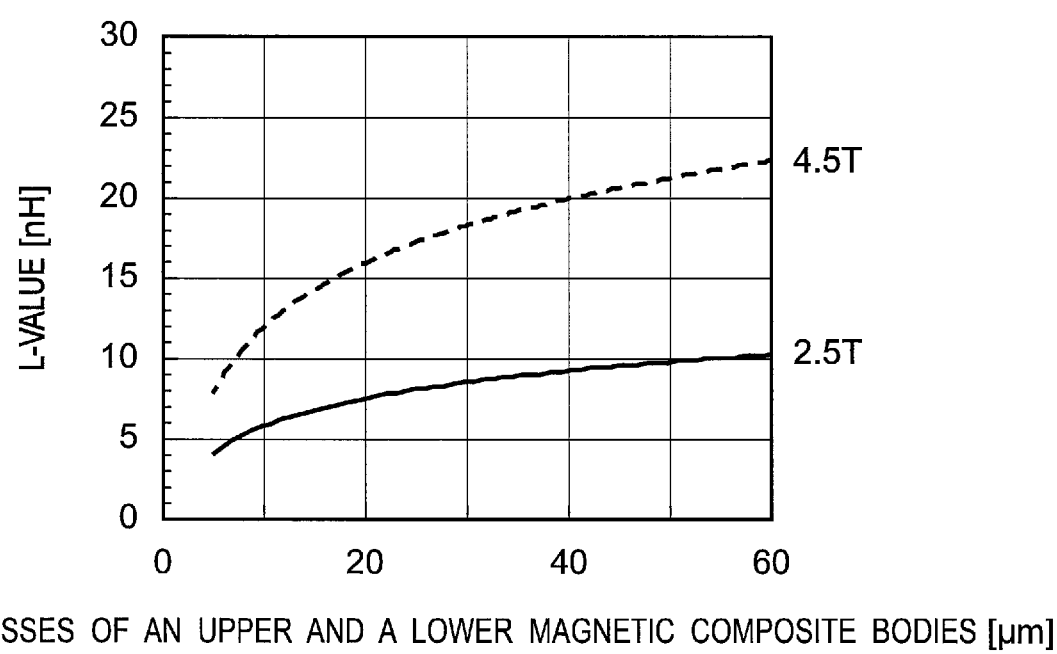
FIG. 4 is a graph of a relation between an inductance value and thicknesses of an upper and a lower magnetic composite bodies.

FIG. 4 depicts the relation between the inductance value (the L-value) and the thicknesses of the magnetic composite bodies on and beneath the spiral wires, for each number of the turns of the spiral wires. FIG. 4 depicts the values measured using an electromagnetic field simulation concerning the magnetic composite body that satisfies the conditions of this application. A solid line therein represents the case of 2.5 turns and a dotted line therein represents the case of 4.5 turns. As depicted in FIG. 4, because the L-value saturates against the thickness, reduction of the height of the component can be facilitated securing the L-value necessary for a high speed switching operation by setting the thicknesses of the magnetic composite bodies thereon and thereebeneath to each be equal to or smaller than 50 μm.

According to the inductor component 1, because the upper end faces 11a and 12a of the first and the second external terminals 11 and 12 are positioned in the same plane as that of the upper end face 30a of the magnetic composite body 30, the first and the second external terminals 11 and 12 do not protrude from the upper end face 30a of the magnetic composite body 30 and reduction of the height can be facilitated.

According to the inductor component 1, because the first and the second external terminals 11 and 12 are buried in the magnetic composite body 30, downsizing can be facilitated.

Example 1

An Example of the first embodiment will be described. The inductor component is a power inductor that is used in a step-down switching regulator for a switching frequency of 100 MHz and that has the size of 1 mm×0.5 mm and the thickness of 0.23 mm. The number of turns of the inductor including the spiral wires is 2.5 in the two-layer structure, and the inductance value thereof is about 5 nH at 100 MHz.

The number of turns of each of the spiral wires is set to be able to acquire the necessary inductance value matching with the switching frequency. The number of turns is set to be equal to or smaller than 5 for a switching frequency of 50 MHz to 100 MHz.

The spiral wire has the size of L/S/t=70/10/70 μm, and L and t are set corresponding to the chip size and the allowable current to be energized to the inductor. The interlayer pitch of the spiral wires is 10 μm that is equal to the wire pitch, and the spiral wires can densely be wound and downsizing and reduction of the height of the inductor are enabled by setting the pitch between the wires and the interlayer pitch of the spiral wires to be equal to or smaller than 10 μm to be significantly narrow.

Second Embodiment

Figure 5:
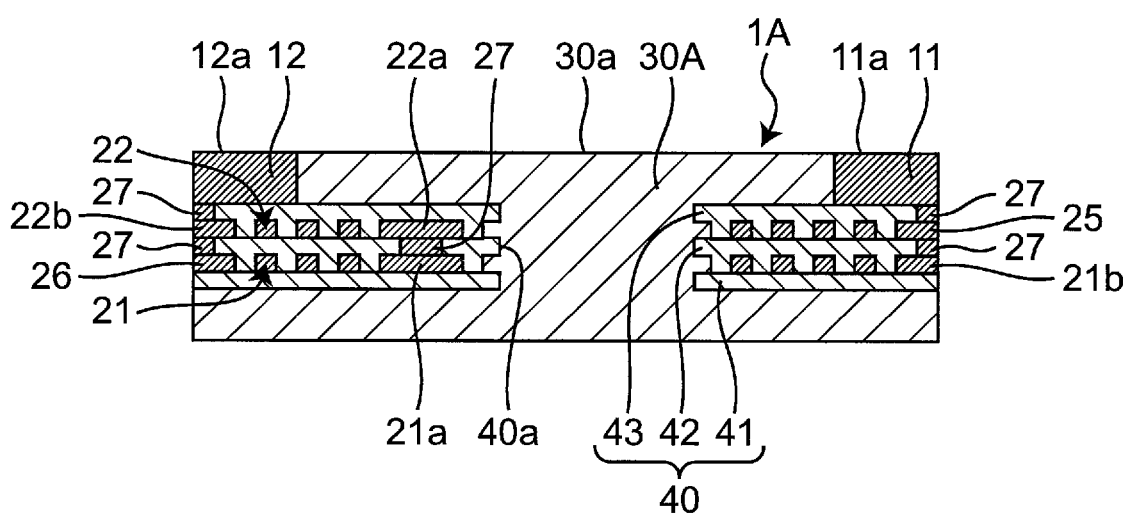
FIG. 5 is a cross-sectional diagram of a second embodiment of the inductor component of the present disclosure.

FIG. 5 is a cross-sectional diagram of the second embodiment of the inductor component of the present disclosure. The second embodiment is different from the first embodiment only in the configuration of the composite body. Only the different configuration will be described. In the second embodiment, the same reference numerals as those of the first embodiment denote the same configurations as those of the first embodiment and will not again be described.

As depicted in FIG. 5, the composite body of an inductor component 1A includes an insulating composite body 40 that covers the first and a second spiral wires 21 and 22, and a magnetic composite body 30A that covers the insulating composite body 40. The material of the magnetic composite body 30A is the same as the material of the magnetic composite body 30 of the first embodiment.

The insulating composite body 40 includes the composite material of the inorganic filler and the resin. The resin is an organic insulating material including, for example, an epoxy-based resin, bismaleimide, a liquid crystal polymer, polyimide, or the like. The average particle diameter of the inorganic filler is equal to or smaller than 5 μm. The inorganic filler is an insulating substance such as $SiO_2$.

Preferably, the inorganic filler is $SiO_2$ having the average particle diameter equal to or smaller than 0.5 μm. Preferably, the content rate of the inorganic filler is equal to or higher than 20 Vol % and equal to or lower than 70 Vol % relative to the insulating composite body 40.

The insulating composite body 40 includes a hole 40a at the position corresponding to the inner diameter portion of each of the first and the second spiral wires 21 and 22. The magnetic composite body 30A is disposed in the hole 40a of the insulating composite body 40 that corresponds to the inner magnetic path, and on and beneath the insulating composite body 40 that corresponds to the outer magnetic paths.

The insulating composite body 40 includes first to third composite layers 41 to 43. The first to the third composite layers 41 to 43 are sequentially disposed from a lower layer to an upper layer. The first spiral wire 21 is stacked on the first composite layer 41. The second composite layer 42 is stacked on the first spiral wire 21 to cover the first spiral wire 21. The second spiral wire 22 is stacked on the second composite layer 42. The third composite layer 43 is stacked on the spiral wire 22 to cover the second spiral wire 22.

The upper end faces 11a and 12a of the first and the second external terminals 11 and 12 are positioned in the same plane as that of the upper end face 30a of the magnetic composite body 30A. The first and the second external terminals 11 and 12 are buried in the magnetic composite body 30A.

A manufacture method of the inductor component 1A will be described.

Figure 6A:
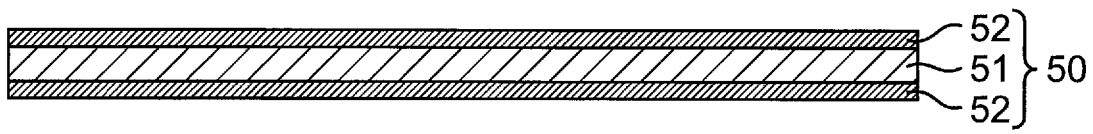
FIG. 6A is a diagram for explaining a manufacture method of the inductor component.

As depicted in FIG. 6A, the base platform 50 is prepared. The base platform 50 includes the insulating substrate 51 and the base metal layers 52 disposed on both sides of the insulating substrate 51. In this embodiment, the insulating substrate 51 is a glass epoxy substrate and the base metal layer 52 is a Cu foil sheet. The thickness of the base platform 50 does not influence the thickness of the inductor component 1A and any base platform 50 having a thickness suitable for easy handling may properly be used because of the reasons such as warpage generated in the processing.

Figure 6B:
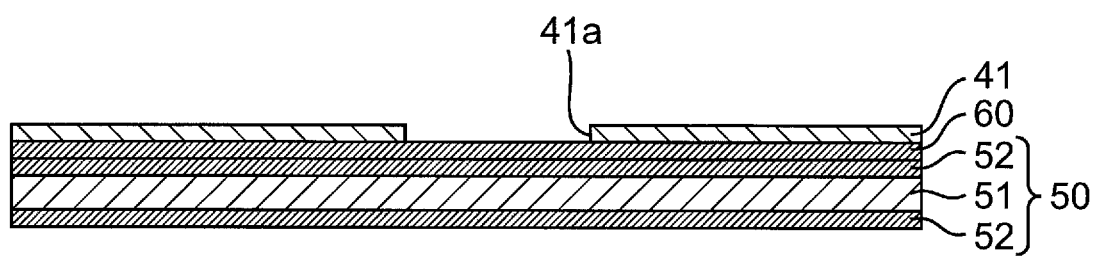
FIG. 6B is a diagram for explaining the manufacture method of the inductor component.

As depicted in FIG. 6B, the dummy metal layer 60 is bonded to the one face of the base platform 50. In this embodiment, because the dummy metal layer 60 is a Cu foil sheet. Because the dummy metal layer 60 is bonded to the base metal layer 52 of the base platform 50, the dummy metal layer 60 is bonded to the smooth face of the base metal layer 52. The adhesive force between the dummy metal layer 60 and the base metal layer 52 can therefore be weakened and, in the post-process, the base platform 50 can be easily peeled off from the dummy metal layer 60. Preferably, the adhesive bonding the base platform 50 and the dummy metal layer 60 to each other is a low adhesion adhesive. To weaken the adhesive force between the base platform 50 and the dummy metal layer 60, the bonding surface of each of the base platform 50 and the dummy metal layer 60 is advantageously a glossy surface.

The first composite layer 41 is thereafter stacked on the dummy metal layer 60 that is temporarily bonded to the base platform 50. At this time, the first composite layer 41 is thermally compressed and thermally cured using a vacuum laminator, a pressing machine, or the like. A portion of the first composite layer 41 corresponding to the inner magnetic path (the magnetic core) is thereafter removed using a laser or the like to dispose an opening 41a.

Figure 6C:
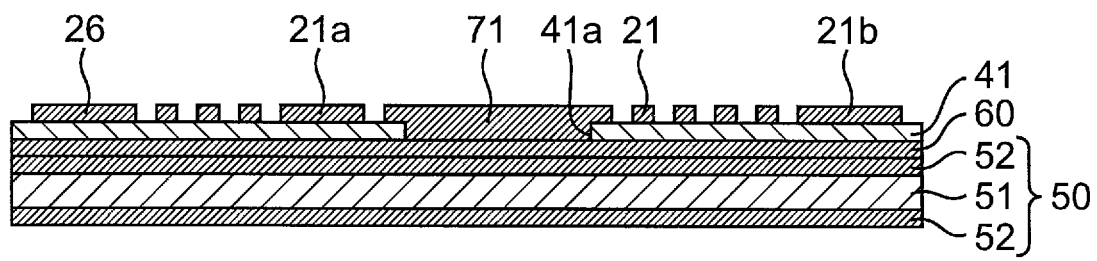
FIG. 6C is a diagram for explaining the manufacture method of the inductor component.

As depicted in FIG. 6C, the first spiral wire 21 and the second connection wire 26 are stacked on the first composite layer 41. The first spiral wire 21 and the second connection wire 26 are not in contact with each other. The second connection wire 26 is disposed on a side opposite to that of the outer circumference part 21b. For example, a power supply film for the SAP (Semi Additive Process) is disposed on the first composite layer 41 using electroless plating, sputtering, vapor deposition, or the like. After disposing the power supply film, a photosensitive resist is applied or attached to the power supply film and the wire pattern is formed using photolithography. The metal wires corresponding to the wires 21 and 22 are thereafter disposed using the SAP. After disposing the metal wires, the photosensitive resist is peeled and removed using a chemical solution and the power supply film is removed by etching. Additional Cu electrolytic plating is thereafter applied using the metal wires as a power supply part, and the wires 21 and 22 each having a narrower space can thereby be acquired. A first sacrifice conductor 71 corresponding to the inner magnetic path is disposed on the dummy metal layer 60 in the opening 41a of the first composite layer 41. The first sacrifice conductor 71 is disposed using the SAP. In this embodiment, the Cu wire having L (the wire width)/S (the wire space (the wire pitch))/t (the wire thickness) to be 50/30/60 μm is disposed using the SAP and a wire having L/S/t=75/5/73 μm can thereafter be acquired by executing additional Cu electrolytic plating therefor that corresponds to the thickness of 12.5 μm.

Figure 6D:
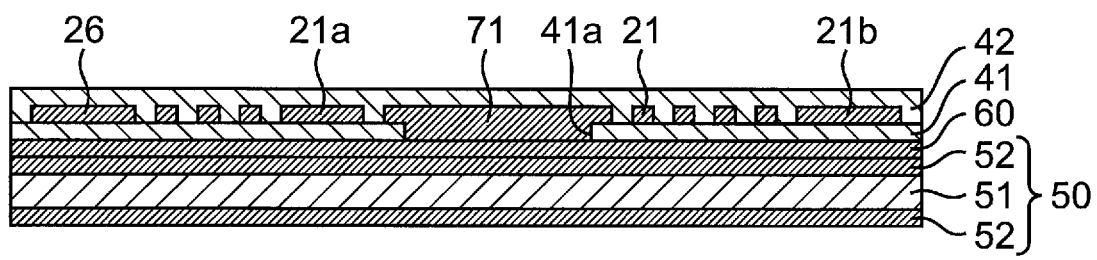
FIG. 6D is a diagram for explaining the manufacture method of the inductor component.

As depicted in FIG. 6D, the second composite layer 42 is stacked on the first spiral wire 21 to cover the first spiral wire 21 with the second composite layer 42. The second composite layer 42 is thermally compressed and thermally cured using a vacuum laminator, a pressing machine, or the like. At this time, the thickness of the second composite layer 42 above the first spiral wire 21 is set to be equal to or smaller than 5 μm. The interlayer pitch of the first and the second spiral wires 21 and 22 can thereby be set to be equal to or smaller than 5 μm.

To secure the filling property into the wire pitch (for example, 5 μm) of the first spiral wire 21, the inorganic filler (the insulating substance) included in the second composite layer 42 needs to have the particle diameter that is sufficiently smaller than the wire pitch of the first spiral wire 21. To realize the reduction of the thickness of the component, the interlayer pitch for the continued wire in the upper portion needs to be reduced to be equal to or smaller than, for example, 5 μm, and the insulating substance therefore needs to also have a particle diameter that is sufficiently small.

Figure 6E:
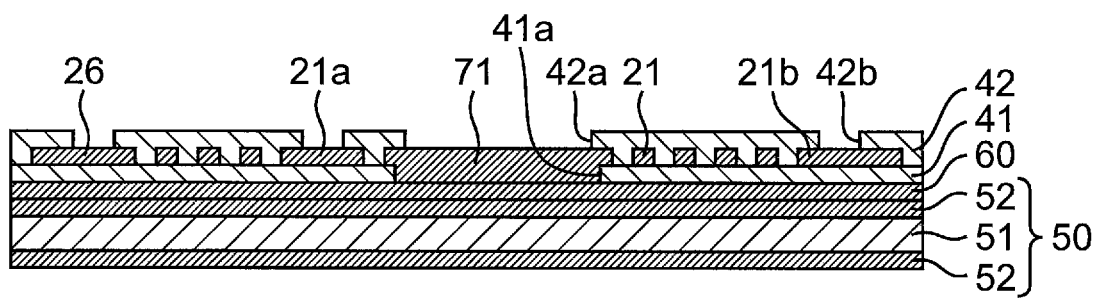
FIG. 6E is a diagram for explaining the manufacture method of the inductor component.

As depicted in FIG. 6E, via holes 42b to be filled with the via wires 27 are disposed in the second composite layer 42 using laser processing or the like. A portion of the second composite layer 42 corresponding to the inner magnetic path (the magnetic core) is removed using a laser or the like and an opening 42a is disposed.

Figure 6F:
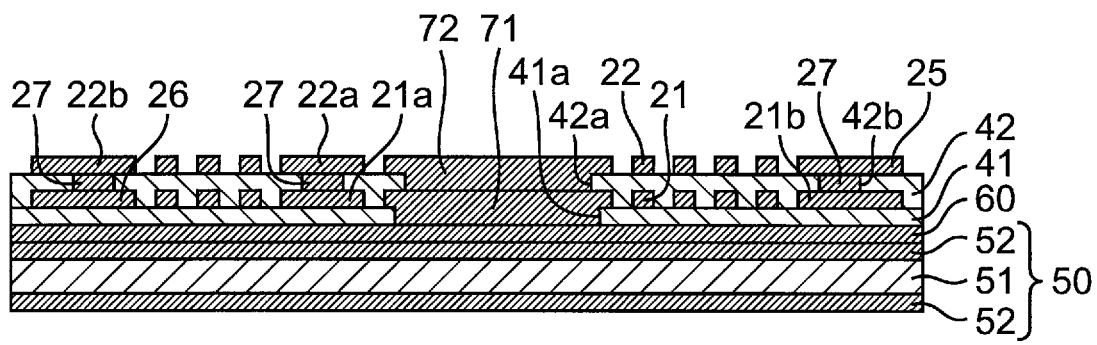
FIG. 6F is a diagram for explaining the manufacture method of the inductor component.

As depicted in FIG. 6F, the via holes are filled with the via wires 27 and the second spiral wire 22 and the first connection wire 25 are stacked on the second composite layer 42. The second spiral wire 22 and the first connection wire 25 are not in contact with each other. The first connection wire 25 is disposed on a side opposite to that of the outer circumference part 22b. At this time, the second spiral wire 22 is disposed using the same process as that for the first spiral wire 21. A second sacrifice conductor 72 corresponding to the inner magnetic path is disposed on the first sacrifice conductor 71 in the opening 42a of the second composite layer 42. At this time, the via wires 27, the second spiral wire 22, the first connection wire 25, and the second sacrifice conductor 72 can be disposed using the same process as that for the first spiral wire 21.

Figure 6G:
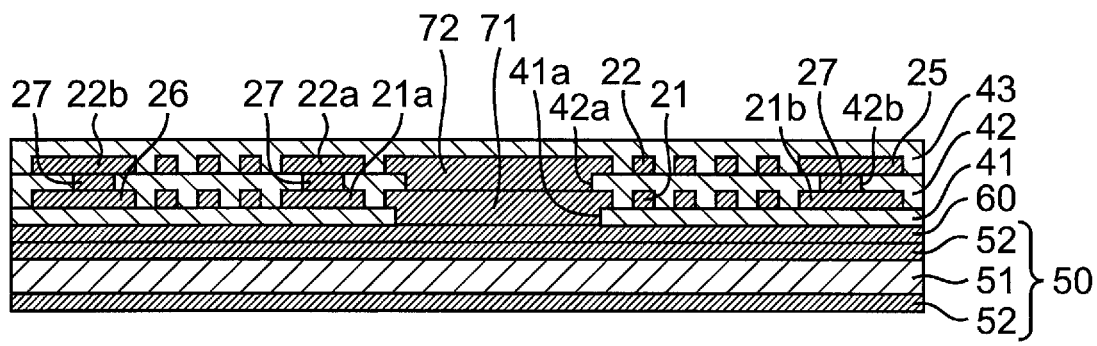
FIG. 6G is a diagram for explaining the manufacture method of the inductor component.

As depicted in FIG. 6G, the third composite layer 43 is stacked on the second spiral wire 22 to cover the second spiral wire 22 with the third composite layer 43. The third composite layer 43 is thermally compressed and thermally cured using a vacuum laminator, a pressing machine, or the like.

Figure 6H:
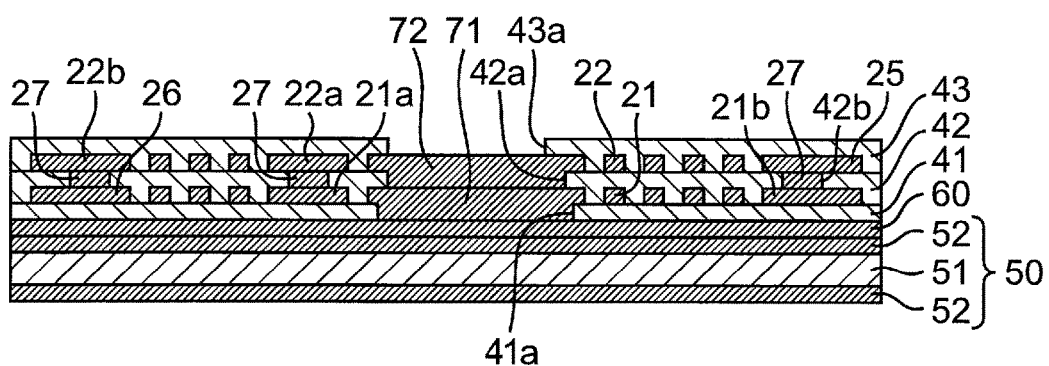
FIG. 6H is a diagram for explaining the manufacture method of the inductor component.

As depicted in FIG. 6H, a portion of the third composite layer 43 corresponding to the inner magnetic path (the magnetic core) is removed using a laser or the like to dispose an opening 43a.

Figure 6I:
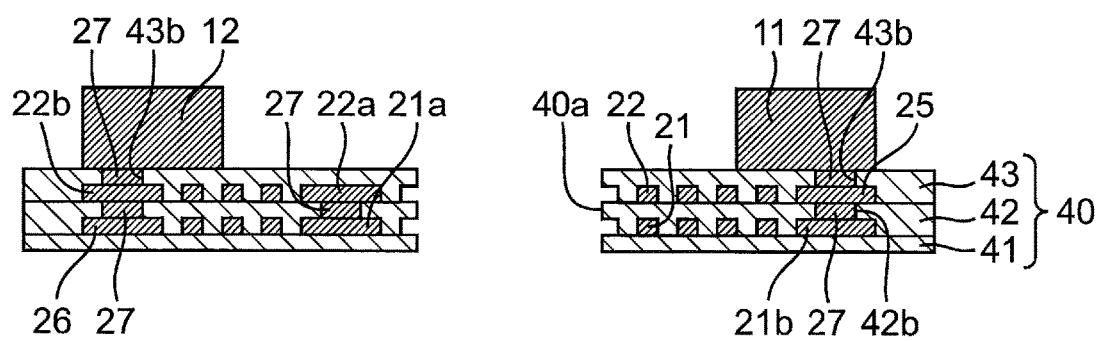
FIG. 6I is a diagram for explaining the manufacture method of the inductor component.

The base platform 50 is thereafter peeled off from the dummy metal layer 60 in the adhesion surface between the one face of the base platform 50 (the base metal layer 52) and the dummy metal layer 60. The dummy metal layer 60 is removed by etching or the like, the first and the second sacrifice conductors 71 and 72 are removed by etching or the like, and, as depicted in FIG. 6I, a hole 40a corresponding to the inner magnetic path is disposed in the insulating composite body 40. Via holes 43b to be filled with the via wires 27 are thereafter disposed in the third composite layer 43 using laser processing or the like. The via holes 43b are filled with the via wires 27, and the first and the second external terminals 11 and 12 each having a columnar shape are stacked on the third composite layer 43. At this time, the via wires 27, and the first and the second external terminals 11 and 12 can be disposed using the same process as that for the first spiral wire 21.

Figure 6J:
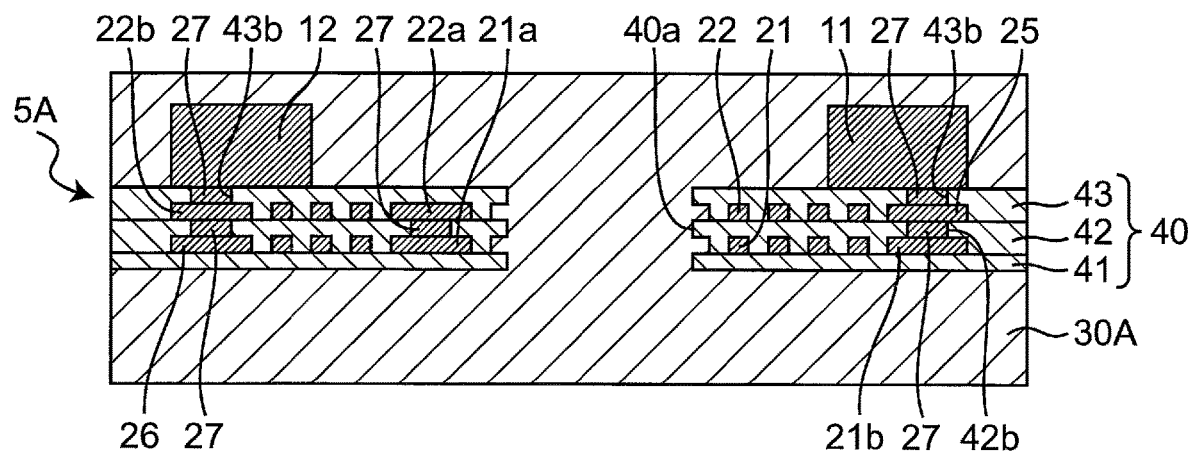
FIG. 6J is a diagram for explaining the manufacture method of the inductor component.

As depicted in FIG. 6J, the first and the second external terminals 11 and 12, and the insulating composite body 40 are covered with the magnetic composite body 30A, and an inductor substrate 5A is thereby formed. The magnetic composite body 30A is thermally compressed and thermally cured using a vacuum laminator, a pressing machine, or the like. The magnetic composite body 30A also fills the hole 40a of the insulating composite body 40.

Figure 6K:
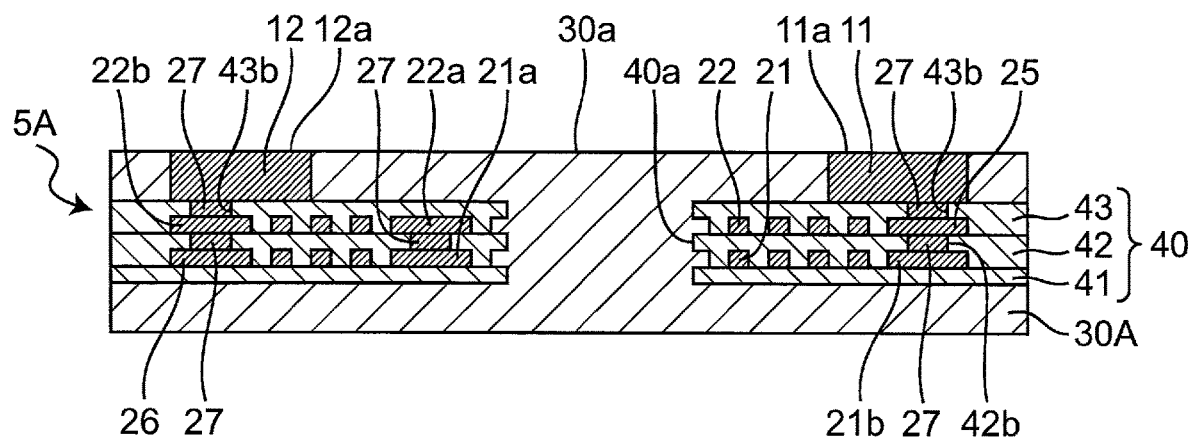
FIG. 6K is a diagram for explaining the manufacture method of the inductor component.

As depicted in FIG. 6K, the magnetic composite body 30A on and beneath the inductor substrate 5A is processed to be a thin film using a grinding process. At this time, a portion of each of the first and the second external terminals 11 and 12 is exposed and upper end faces 11a and 12a of the first and the second external terminals 11 and 12 are thereby positioned in the same plane as that of the upper end face 30a of the magnetic composite body 30A. In this case, reduction of the thickness of the component can be facilitated by grinding the magnetic composite body 30A to have a thickness that is sufficient to be able to acquire an inductance value. For example, in this embodiment, the thickness thereof can be set to be 35 μm.

The inductor substrate 5A is thereafter divided into individual chips by dicing and scribing to form the inductor components 1A each depicted in FIG. 5. After the division into individual chips, a plating film of NiSn or the like may be applied to the first and the second external terminals 11 and 12 using a method such as barrel plating to enhance the mounting property thereof.

Though the inductor substrate 5A is disposed on one face of both faces of the base platform 50, the inductor substrate 5A may be disposed on each of both faces of the base platform 50. High productivity can thereby be achieved.

According to the inductor component 1A, because the composite body includes the insulating composite body 40 and the magnetic composite body 30A, the insulation between the wires and the interlayer insulation of the first and the second spiral wires 21 and 22 can be secured by the insulating composite body 40, and a high inductance value can be acquired due to the magnetic composite body 30A.

According to the inductor component 1A, the inorganic filler of the insulating composite body 40 is $SiO_2$ having the average particle diameter equal to or smaller than 0.5 μm, the insulation between the wires and the interlayer insulation of the first and the second spiral wires 21 and 22 can therefore be enhanced, and downsizing and reduction of the height can further be facilitated. Compared to the first embodiment, the insulation between the wires and the interlayer insulation can further be enhanced by employing the insulating substance as the inorganic filler, and the wire pitch of the first and the second spiral wires 21 and 22, and the interlayer pitch can therefore be reduced.

According to the inductor component 1A, because the content rate of the inorganic filler of the insulating composite body 40 is equal to or higher than 20 Vol % and equal to or lower than 70 Vol %, the fluidity and the insulation can concurrently be established.

Example 2

An Example of the second embodiment will be described. The inductor component is a power inductor that is used as a use thereof in a step-down switching regulator for a switching frequency of 100 MHz and that has the size of 1 mm×0.5 mm and the thickness of 0.23 mm. The number of turns of each of the spiral wires is 2.5 in the two-layer structure, and the inductance value thereof is about 5 nH at 100 MHz.

The number of turns of each of the spiral wires is set to be able to acquire the necessary inductance value matching with the switching frequency. The number of turns is set to be equal to or smaller than 10 for a switching frequency of 40 MHz to 100 MHz.

Though the Example is depicted that includes the spiral wire whose L/S/t is L/S/t=75/5/73 μm, L and t are set corresponding to the chip size and the allowable current to be energized to the inductor. The interlayer pitch of the spiral wires is 5 μm that is equal to the wire pitch, and the spiral wires can densely be wound and downsizing and reduction of the height of the inductor are enabled by setting the wire pitch and the interlayer pitch of the spiral wires to be equal to or smaller than 10 μm to significantly be narrow.

Third Embodiment

Figure 7A:
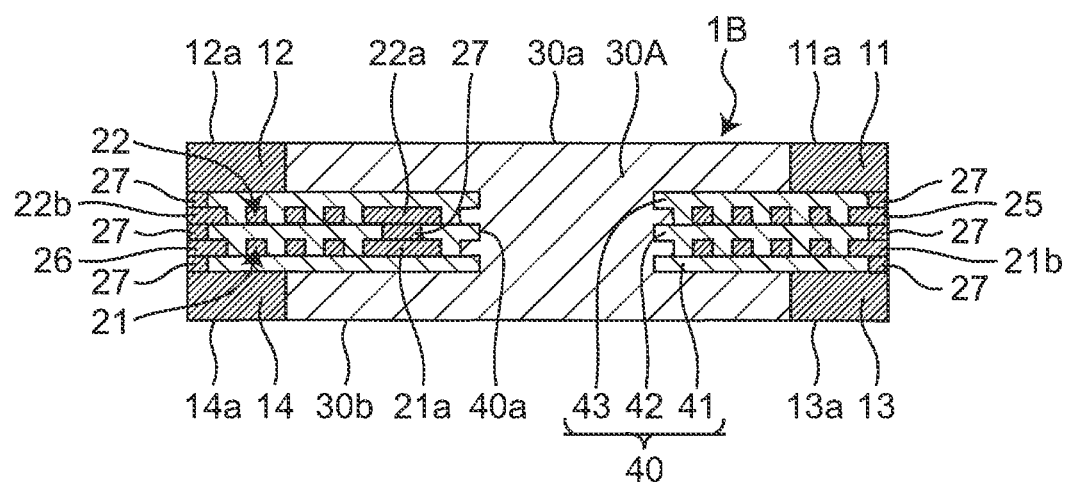
FIG. 7A is a cross-sectional diagram of a third embodiment of the inductor component of the present disclosure.

FIG. 7A is a cross-sectional diagram of the third embodiment of the inductor component of the present disclosure. The third embodiment is different from the second embodiment only in the quantity of the external terminals, and copes with incorporation thereof into a package substrate. Only the different configuration will be described. In the third embodiment, the same reference numerals as those of the second embodiment denote the same configurations as those of the second embodiment and will not again be described.

As depicted in FIG. 7A, in an inductor component 1B, the external terminals 11 to 14 are disposed both over and under the first and the second spiral wires 21 and 22 in the stacking direction. The inductor component 1B includes the third and the fourth external terminals 13 and 14 in addition to the first and the second external terminals 11 and 12 of the second embodiment.

The third and the fourth external terminals 13 and 14 are disposed under the first and the second spiral wires 21 and 22 in the stacking direction. The third external terminal 13 faces the first external terminal 11 and is electrically connected to the first external terminal 11 through the via wire 27. The fourth external terminal 14 faces the second external terminal 12 and is electrically connected to the second external terminal 12 through the via wire 27.

Lower end faces 13*a* and 14*a* of the third and the fourth external terminals 13 and 14 in the stacking direction are positioned in the same plane as that of a lower end face 30*b* of the magnetic composite body 30A in the stacking direction. The third and the fourth external terminals 13 and 14 are buried in the magnetic composite body 30A.

A manufacture method of the inductor component 1B will be described.

A method is executed that is the same as the method depicted in FIG. 6A to FIG. 6H of the second embodiment.

Figure 8A:
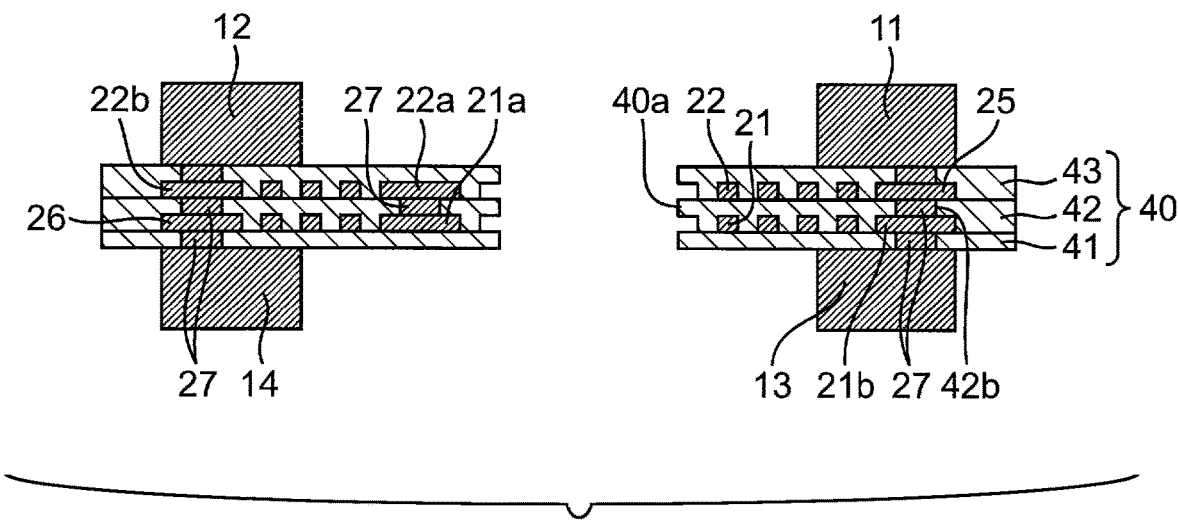
FIG. 8A is a diagram for explaining a manufacture method of the inductor component.

As depicted in FIG. 8A, the hole 40*a* corresponding to the inner magnetic path is disposed in the insulating composite body 40. The via holes 43*b* in the upper and the lower face of the insulating composite body 40 are filled with the via wires 27. The first and the second external terminals 11 and 12 each having a columnar shape are disposed on the upper face of the third composite layer 43, and the third and the fourth external terminals 13 and 14 each having a columnar shape are disposed on the lower face of the first composite layer 41. In this case, the via wires 27 and the first, the second, the third, and the fourth external terminals 11, 12, 13, and 14 can be disposed using the same process as that for the first spiral wire 21.

Figure 8B:
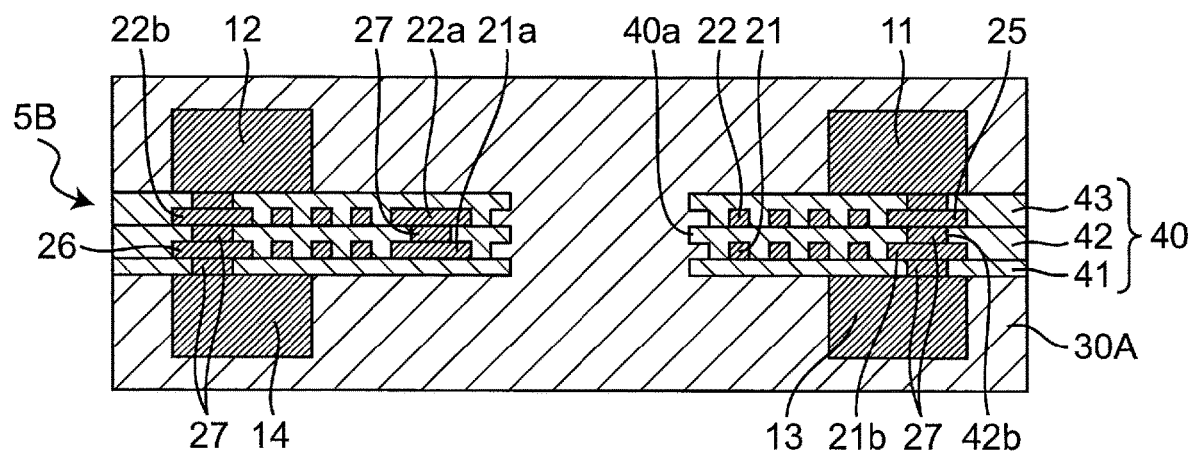
FIG. 8B is a diagram for explaining the manufacture method of the inductor component.

As depicted in FIG. 8B, the first to the fourth external terminals 11 to 14 and the insulating composite body 40 are covered with the magnetic composite body 30A and the inductor substrate 5B is thereby formed. The magnetic composite body 30A is thermally compressed and thermally cured using a vacuum laminator, a pressing machine, or the like. The hole 40*a* of the insulating composite body 40 is also filled with the magnetic composite body 30A.

Figure 8C:
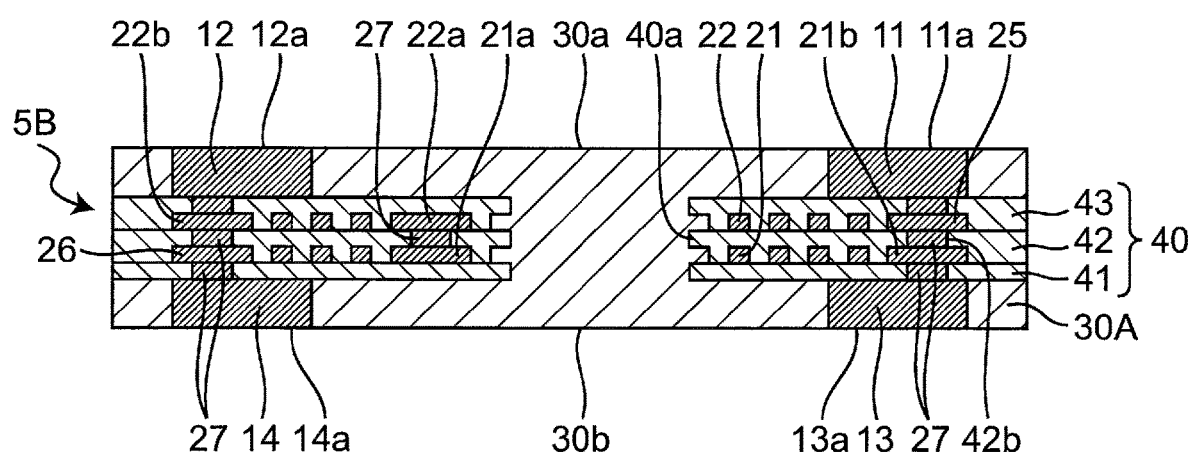
FIG. 8C is a diagram for explaining the manufacture method of the inductor component.

As depicted in FIG. 8C, the magnetic composite body 30A on and under the inductor substrate 5B is processed to be a thin film using a grinding process. In this case, a portion of each of the first to the fourth external terminals 11 to 14 is exposed, the upper end faces 11*a* and 12*a* of the first and the second external terminals 11 and 12 are thereby positioned in the same plane as that of the upper end face 30*a* of the magnetic composite body 30A, and the lower end faces 13*a* and 14*a* of the third and the fourth external terminals 13 and 14 are thereby positioned in the same plane as that of the lower end face 30*b* of the magnetic composite body 30A. In this case, reduction of the thickness of the component can be facilitated by grinding the magnetic composite body 30 to have a thickness that is sufficient to be able to acquire an inductance value.

The inductor substrate 5B is thereafter divided into individual chips by dicing and scribing to form the inductor components 1B each depicted in FIG. 7A. After the division into individual chips, a plating film of NiSn or the like may be applied to the first and the second external terminals 11 and 12 using a method such as barrel plating to enhance the mounting property thereof.

Though the inductor substrate 5B is formed on one face of both faces of the base platform 50, the inductor substrate 5B may be formed on each of both faces of the base platform 50. High productivity can thereby be achieved.

According to the inductor component 1B, because the external terminals 11 to 14 are disposed both over and under the spiral wires 11 and 12 in the stacking direction, wires conductive for the external terminals 11 to 14 on and beneath the inductor component 1B can be disposed on the upper and the lower faces of the substrate when the inductor component 1B is buried in the substrate. The output side of the chopper circuit branched into two directions that are the side to connect the load and the ground side through the smoothing capacitor can therefore be connected to each other in the shortest course without running any more wire around, by the upper and the lower external terminals that are electrically connected to each other. The ESR and the ESL of the smoothing capacitor on the output side can therefore be reduced and the ripple voltage of the output can be reduced.

Figure 7B:
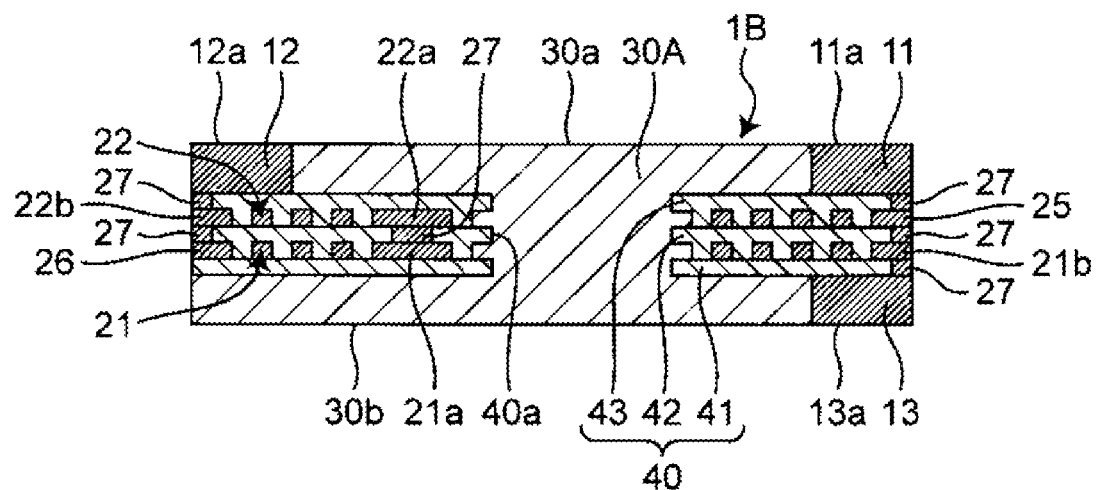
FIG. 7B is a cross-sectional diagram of an alternative configuration of the inductor component of the present disclosure.

Because the two terminals are used only for the external terminals on the output side as above, the external terminal on the input side may be one and, for example, either the external terminal 13 or 14 does not need to be disposed in the inductor component 1B. This configuration is shown in FIG. 7B, for example, where only external terminal 13 is used. Disposing both of the external terminals 13 and 14 can however improve the symmetry in the inductor component 1B, and can facilitate reduction of asymmetry of the property, improvement of the degree of freedom of wiring, improvement of co-planarity of the overall component, and the like.

Example 3

An Example of the third embodiment will be described. The inductor component is a power inductor that is used as a use thereof in a step-down switching regulator for a switching frequency of 100 MHz and that has the size of 1 mm×0.5 mm and the thickness of 0.23 mm. The number of turns of each of the spiral wires is 2.5 in the two-layer structure, and the inductance value thereof is about 5 nH at 100 MHz.

Fourth Embodiment

Figure 9:
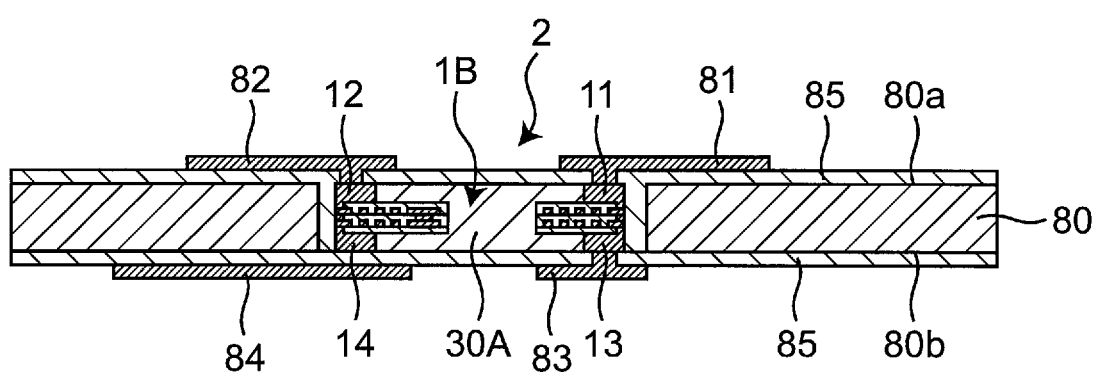
FIG. 9 is a cross-sectional diagram of a first embodiment of a package component of the present disclosure.

FIG. 9 is a cross-sectional diagram of one embodiment of the package component of the present disclosure. In the fourth embodiment, the same reference numerals as those of the third embodiment denote the same configurations as those of the third embodiment and will not again be described.

As depicted in FIG. 9, the package component 2 is a module that includes a substrate in an IC package and includes the substrate 80 and the inductor component 1B of the third embodiment that is buried in the substrate 80. The substrate 80 includes, for example, FR4, CES3, or the like. The first and the second external terminals 11 and 12 on the upper side of the inductor component 1B are disposed on the side of an upper face 80*a* of the substrate 80. The third and the fourth external terminals 13 and 14 on the lower side of the inductor component 1B are disposed on the side of a lower face 80*b* of the substrate 80.

Wires 81 and 82 are disposed on the upper face 80*a* of the substrate 80 through an insulating resin 85. The first wire 81 is electrically connected to the first external terminal 11 through an opening of the insulating resin 85. The second wire 82 is electrically connected to the second external terminal 12 through an opening of the insulating resin 85.

Wires 83 and 84 are disposed on the lower face 80*b* of the substrate 80 through the insulating resin 85. The third wire 83 is electrically connected to the third external terminal 13 through an opening of the insulating resin 85. The fourth wire 84 is not electrically connected to any of the external terminals 11 to 14.

A manufacture method of the package component 2 will be described.

Figure 10A:
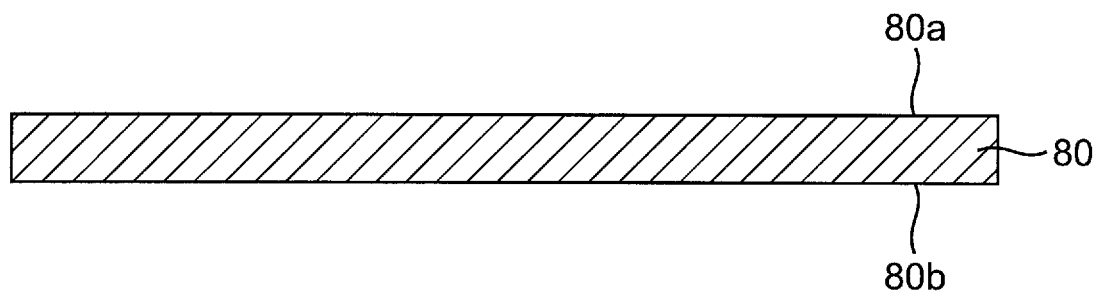
FIG. 10A is a diagram for explaining a manufacture method of the package component.

As depicted in FIG. 10A, the substrate 80 is prepared. For example, a thin substrate having a thickness of 0.33 mm, 0.23 mm, or the like is used as the substrate 80 for downsizing and reduction of the height of the IC.

Figure 10B:
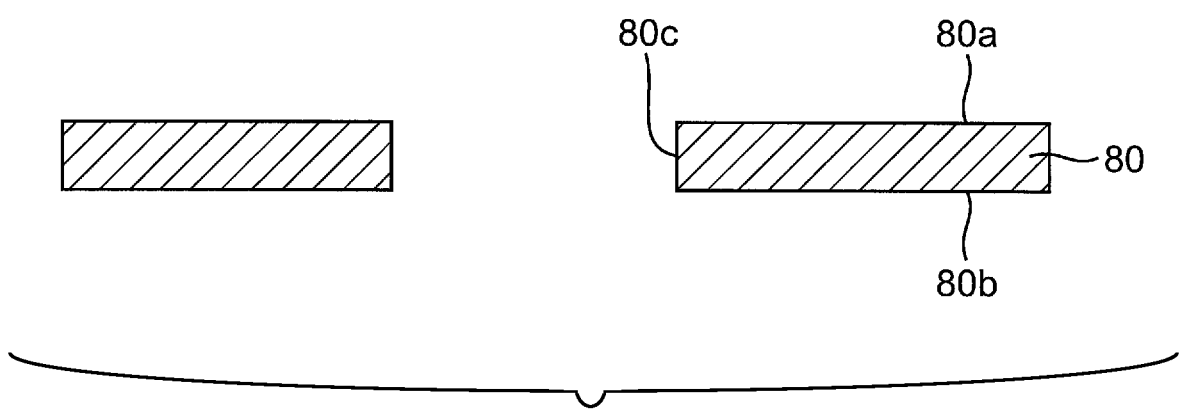
FIG. 10B is a diagram for explaining the manufacture method of the package component.

As depicted in FIG. 10B, a penetrating hole 80c is disposed in the substrate 80 using a drill, a laser, or the like.

Figure 10C:
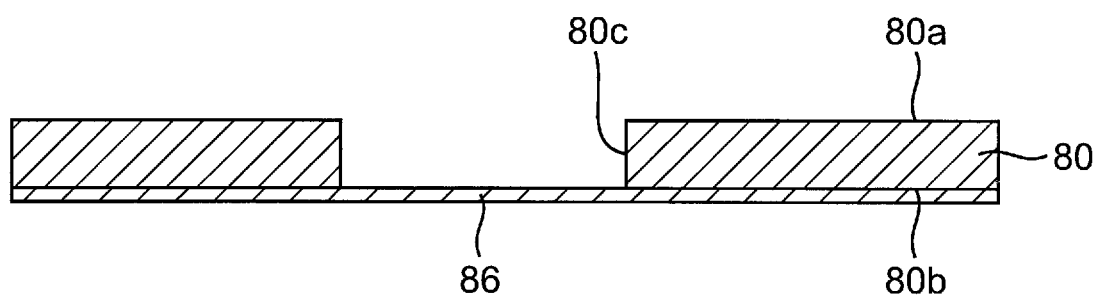
FIG. 10C is a diagram for explaining the manufacture method of the package component.

As depicted in FIG. 10C, a temporary attachment tape 86 with low adhesion is attached to the lower face 80b of the substrate 80. A thermally foamed sheet or the like may be used instead of the temporary attachment tape 86.

Figure 10D:
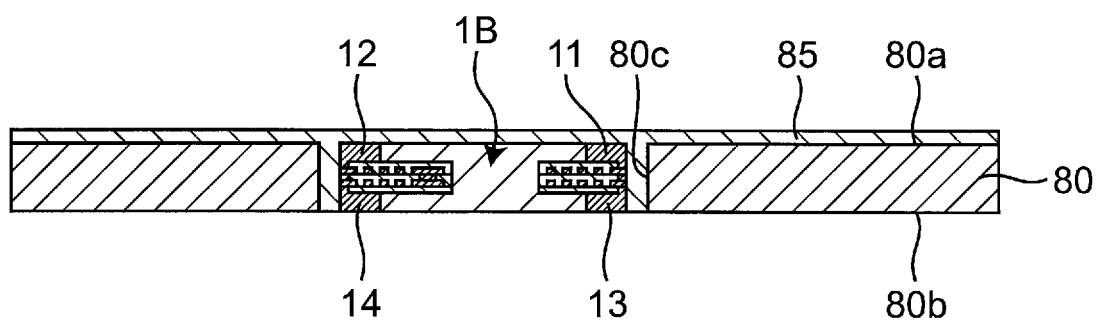
FIG. 10D is a diagram for explaining the manufacture method of the package component.

As depicted in FIG. 10D, the inductor component 1B is installed in the penetrating hole 80c. The insulating resin 85 such as a build-up sheet, a pre-preg, or the like is thereafter laminated on the upper face 80a of the substrate 80, the inductor component 1B and the substrate 80 are sealed, and the temporary attachment tape 86 is removed.

Figure 10E:
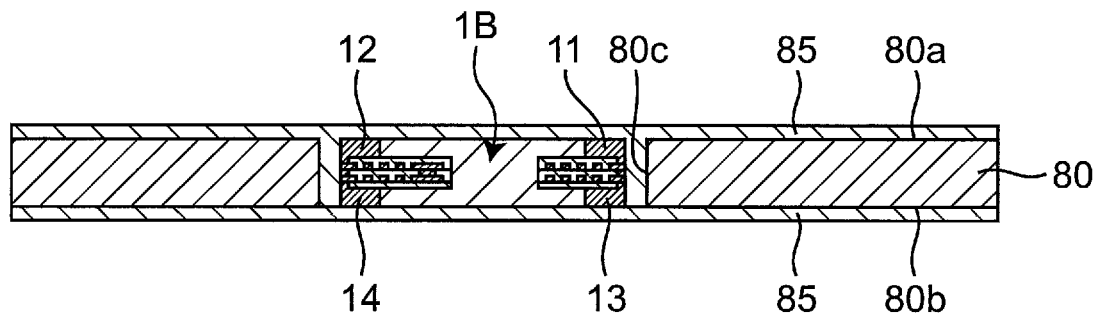
FIG. 10E is a diagram for explaining the manufacture method of the package component.

As depicted in FIG. 10E, the insulating resin 85 is laminated on the lower face 80b of the substrate 80, the insulating resins 85 are thereafter thermally cured, and the substrate 80 having the inductor component 1B buried therein is acquired.

Figure 10F:
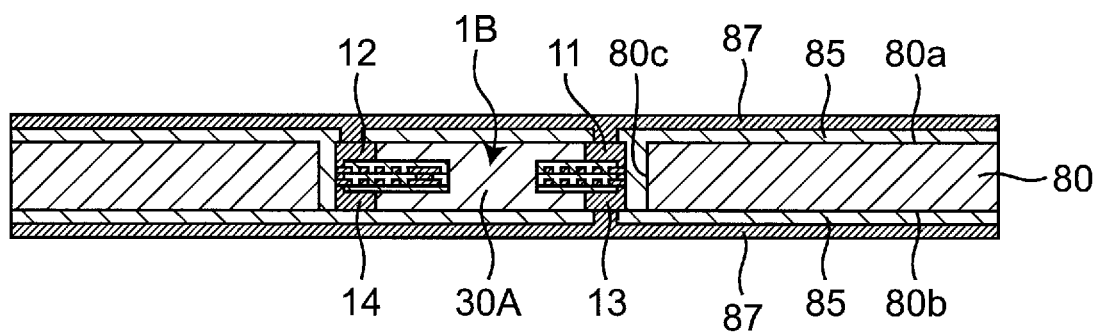
FIG. 10F is a diagram for explaining the manufacture method of the package component.

As depicted in FIG. 10F, via holes are disposed using a laser in the portions of the insulating resins 85 to be contact points between the external terminals 11 to 13 of the inductor component 1B and the circuit. In this case, because the surface of the magnetic composite body 30A and the surfaces of the external terminals 11 to 13 are disposed on the same smooth plane, defective processing due to out-of-focus laser processing and the like tend to be avoided and the productivity can be improved. The smear caused by the laser is thereafter removed and wiring layers 87 are disposed using an approach such as electroless plating or electrolytic plating.

Etching processing is applied to the wiring layers 87 using resist patterns and the like to dispose the necessary lands and wires on the substrate 80 and, as depicted in FIG. 9, the package component 2 can be acquired.

According to the package component 2, the inductor component 1B is buried in the substrate 80, the wires 81 and 82 electrically connected to the external terminals 11 and 12 on the upper side are disposed on the upper face 80a of the substrate 80, and the wire 83 electrically connected to the external terminal 13 on the lower side is disposed on the lower face 80b of the substrate 80. The output side of the chopper circuit can be connected in the shortest course without running any more wire around using the external terminals 11 and 13 on the upper and the lower sides electrically connected to each other. The ESR and the ESL of the smoothing capacitor on the output side can therefore be reduced and the ripple voltage of the output can be reduced.

Fifth Embodiment

Figure 11B:
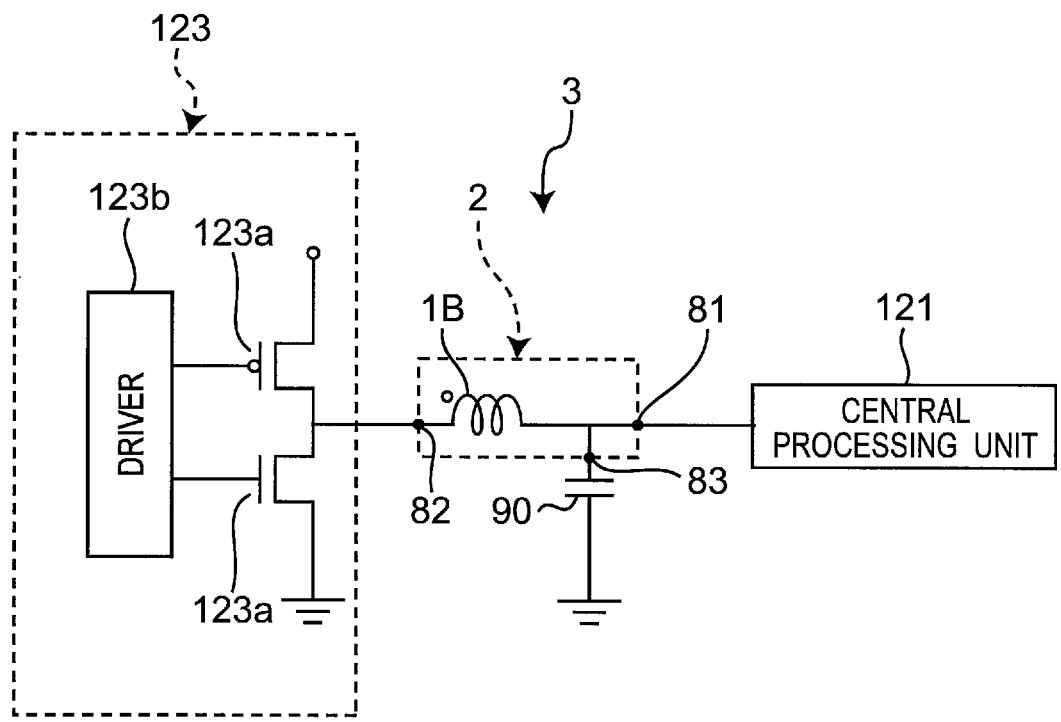
FIG. 11B is an equivalent circuit diagram of the switching regulator.
Figure 12:
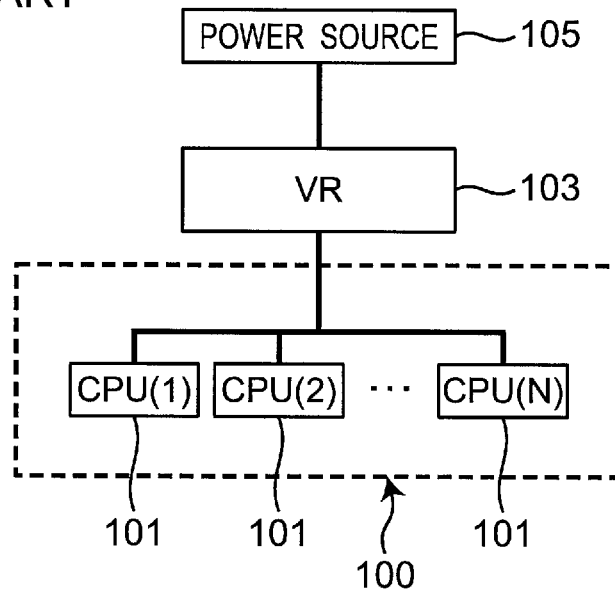
FIG. 12 is a simplified configuration diagram of a traditional system.
Figure 13:
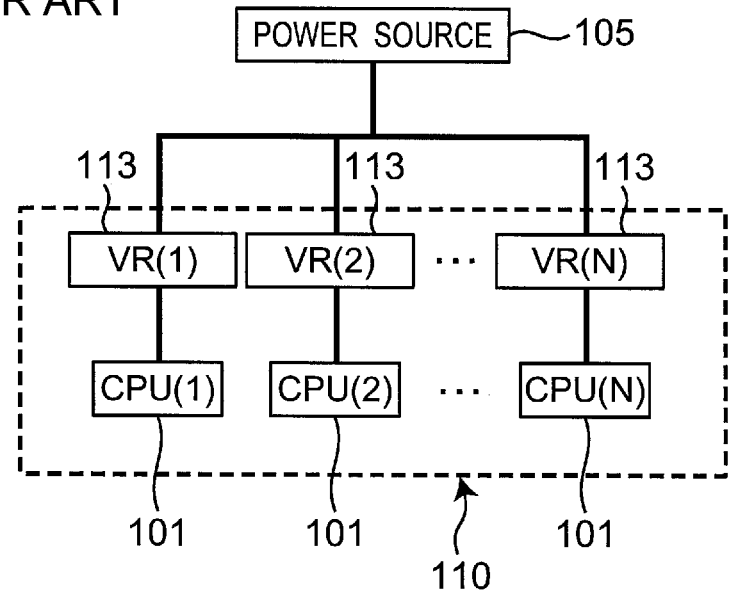
FIG. 13 is a simplified configuration diagram of an IVR system.

FIG. 11A is a cross-sectional diagram of one embodiment of a switching regulator of the present disclosure. FIG. 11B is an equivalent circuit diagram of the switching regulator. In the fifth embodiment, the same reference numerals as those of the fourth embodiment denote the same configurations as those of the fourth embodiment and will not again be described.

As depicted in FIG. 11A and FIG. 11B, the switching regulator 3 plays the role of a voltage regulator (VR) that converts a power source voltage from an external power source (not depicted) into a voltage suitable for a central processing unit 121 and that supplies the converted voltage to the central processing unit 121.

The switching regulator 3 includes the package component 2 of the fourth embodiment, a switching element 123a that opens or closes the electric connection between the external power source and the inductor component 1B, and a smoothing capacitor 90 that smoothes the output voltage from the inductor component 1B.

The switching element 123a is disposed on the side of the upper face 80a of the substrate 80 of the package component 2 and is electrically connected to the second wire 82 connected to the external terminal 12 of the other (on the input side) of the pair (on the input and the output sides) of external terminals. The smoothing capacitor 90 is disposed on the side of the lower face 80b of the substrate 80 of the package component 2 and is electrically connected to the wire 83 on the lower side of the wires 81 and 83 connected to the external terminals 11 and 13 of the one (on the output side) of the pair (on the input and the output sides) of external terminals. The wire 81 on the upper side is the output terminal, of the wires 81 and 83 connected to the external terminals 11 and 13 of the one (on the output side) of the pair (on the input and the output sides) of external terminals.

A voltage regulating part 123 and the central processing unit 121 are integrated in one IC chip 120. The IC chip 120 is mounted on the upper face 80a of the substrate 80 of the package component 2. The voltage regulating part 123 includes the switching element 123a and a driver 123b that drives the switching element 123a. The switching element 123a is connected to the second wire 82 of the package component 2 through an internal connection electrode 91. The central processing unit 121 is connected to the first wire 81 of the package component 2 through the internal connection electrode 91.

The smoothing capacitor 90 is mounted on the lower face 80b of the substrate 80 of the package component 2. An input part of the smoothing capacitor 90 is connected to the third wire 83 of the package component 2. An output part of the smoothing capacitor 90 is connected to the fourth wire 84 of the package component 2. The fourth wire 84 is connected to the ground through an external connection electrode 92.

As above, the switching element 123a is connected to the input part of the inductor component 1B, and the central processing unit 121 and the smoothing capacitor 90 are connected to the output part of the inductor component 1B. Though not depicted, the IC chip 120 and the substrate 80 are integrated with each other by a molded-in epoxy resin or the like to constitute one single IC package.

According to the switching regulator 3, the smoothing capacitor 90 is connected to the wires 83 and 84 on the lower face 80b of the substrate 80 of the package component 2, and the switching element 123a and the central processing unit 121 are connected to the wires 81 and 82 on the upper face 80a of the substrate 80 of the package component 2. The inductor component 1B of the package component 2, and the central processing unit 121 and the smoothing capacitor 90 can thereby be connected to each other in the shortest course without running any more wire around, by the first and the third external terminals 11 and 13 in the upper and the lower portions. The ESR and the ESL of the smoothing capacitor 90 can therefore be reduced and the ripple voltage of the output can be reduced. A load other than the central processing unit 121 may be connected to the first wire 81 to be the output terminal.

The present disclosure is not limited to the embodiments and their designs can be changed within the scope not departing from the gist of the present disclosure. For example, the features of each of the first to the fifth embodiments may variously be combined with each other. Though the inductor component includes the spiral wires in the two layers in the embodiments, the inductor component may include spiral wires in three or more layers.

Though the number of inductors including the spiral wires is one in the embodiments, the number of inductors included in the inductor component is not limited to one. For example, spiral wires having plural spirals in one same plane may configure plural inductors.

The invention claimed is:

1. An inductor component that includes only three external terminals, the inductor component comprising:
    a composite body that includes
        a magnetic composite body that includes a single magnetic inorganic filler and a first resin, and
        an insulating composite body that includes a plurality of composite layers each including a composite material of a single insulating inorganic filler and a second resin,
    the composite body having an upper end face and a lower end face, the lower end face being provided on a surface of the composite body opposite to the upper end face;
    a wire that is disposed inside the composite body, the wire being disposed in a plane parallel to the upper or the lower end face;
    a first external terminal that is disposed in the upper end face of the composite body;
    a second external terminal that is disposed in the upper end face of the composite body; and
    a third external terminal that is disposed in the lower end face of the composite body, wherein
    a first end part of the wire is electrically connected to both the first external terminal and the third external terminal,
    a second end part of the wire is electrically connected to only the second external terminal of the first, second, and third external terminals, and
    the magnetic inorganic filler and the insulating inorganic filler each have an average particle diameter equal to or smaller than 5 µm.

2. The inductor component according to claim 1, wherein the wire is formed in a spiral shape in the plane parallel to the upper or the lower end face.

3. The inductor component according to claim 1, wherein a number of turns of an inductor including the wire is equal to or smaller than 10.

4. The inductor component according to claim 1, further comprising
    a plurality of wires disposed inside the composite body and forming a spiral shape along the plane parallel to the upper or the lower end face.

5. The inductor component according to claim 4, wherein a wire pitch of the wires is equal to or smaller than 10 µm.

6. The inductor component according to claim 4, wherein an interlayer pitch between adjacent wires is equal to or smaller than 10 µm.

7. The inductor component according to claim 1, wherein the insulating inorganic filler is $SiO_2$ with an average particle diameter equal to or smaller than 0.5 µm.

8. The inductor component according to claim 1, wherein the magnetic inorganic filler is an FeSi-based alloy, an FeCo-based alloy, an FeNi-based alloy, or an amorphous alloy of these alloys.

9. The inductor component according to claim 1, wherein a content rate of the magnetic inorganic filler and the insulating inorganic filler is equal to or higher than 20 Vol % and equal to or lower than 70 Vol % relative to the composite body.

10. The inductor component according to claim 1, wherein
    a thickness of the composite body positioned in an upper portion of the wire in a stacking direction and a thickness of the composite body positioned in a lower portion of the wire in the stacking direction are equal to each other.

11. The inductor component according to claim 10, wherein
    the thickness of the composite body positioned in an upper portion of the wire in a stacking direction and the thickness of the composite body positioned in a lower portion of the wire in the stacking direction are each equal to or larger than 10 µm and equal to or smaller than 50 µm.

12. The inductor component according to claim 1, wherein
    the first, second, and third external terminals are buried in the composite body.

13. A package component comprising:
    a substrate; and
    the inductor component according to claim 1 that is buried in the substrate, wherein
    a wire electrically connected to the first external terminal and a wire electrically connected to the second external terminal are disposed on an upper surface of the substrate, and
    a wire electrically connected to the third external terminal is disposed on a lower surface of the substrate.

14. A switching regulator comprising:
    the package component according to claim 13;
    a switching element that opens or closes electric connection between an external power source and the inductor component; and
    a smoothing capacitor that smooths an output voltage from the inductor component, wherein
    the switching element is disposed on the upper surface of the substrate of the package component and is electrically connected to the wire connected to the second external terminal,
    the smoothing capacitor is disposed on the lower surface of the substrate of the package component and is electrically connected to the wire connected to the third external terminal, and
    the wire connected to the first external terminal is an output terminal.

15. An inductor component that includes only three external terminals, the inductor component comprising:
    a composite body that includes a composite material including an inorganic filler and a resin, the composite body having an upper end face and a lower end face, the lower end face being provided on a surface of the composite body opposite to the upper end face;
    a wire that is disposed inside the composite body, the wire being disposed in a plane parallel to the upper or the lower end face;
    a first external terminal that is disposed in the upper end face of the composite body;
    a second external terminal that is disposed in the upper end face of the composite body; and
    a third external terminal that is disposed in the lower end face of the composite body, wherein a first end part of the wire is electrically connected to both the first external terminal and the third external terminal, a second end part of the wire is electrically connected to only the second external terminal of the first, second, and third external terminals, a first via wire is stacked on and directly contacts a connection wire, an outer circumference part of the wire is stacked on and directly contacts the first via wire, a second via wire is stacked on and directly contacts the outer circumference part of the wire, and the second external terminal is stacked on and directly contacts the second via wire, and the connection wire, the first via wire, the outer circumference part of the wire, the second via wire, and the second external terminal are each exposed on a side surface of the composite body.

* * * * *